(12) United States Patent
Taniguchi et al.

(10) Patent No.: US 7,905,011 B2
(45) Date of Patent: *Mar. 15, 2011

(54) BUMP FORMING METHOD AND BUMP FORMING APPARATUS

(75) Inventors: Yasushi Taniguchi, Osaka (JP); Seiichi Nakatani, Osaka (JP); Seiji Karashima, Osaka (JP); Takashi Kitae, Osaka (JP); Susumu Matsuoka, Osaka (JP); Masayoshi Koyama, Osaka (JP)

(73) Assignee: Panasonic Corporation, Osaka (JP)

( * ) Notice: Subject to any disclaimer, the term of this patent is extended or adjusted under 35 U.S.C. 154(b) by 143 days.

This patent is subject to a terminal disclaimer.

(21) Appl. No.: 12/280,907

(22) PCT Filed: Feb. 22, 2007

(86) PCT No.: PCT/JP2007/053866
§ 371 (c)(1),
(2), (4) Date: Aug. 27, 2008

(87) PCT Pub. No.: WO2007/108290
PCT Pub. Date: Sep. 27, 2007

(65) Prior Publication Data
US 2009/0229120 A1 Sep. 17, 2009

(30) Foreign Application Priority Data

Mar. 16, 2006 (JP) .................. 2006-072316
Mar. 27, 2006 (JP) .................. 2006-084569

(51) Int. Cl.
*H01R 9/00* (2006.01)
*B23P 19/00* (2006.01)
(52) U.S. Cl. ............. 29/843; 29/746; 29/842; 29/846; 174/259; 438/108

(58) Field of Classification Search ............. 29/825, 29/829, 846, 746, 842, 843; 174/259; 438/108
See application file for complete search history.

(56) References Cited

U.S. PATENT DOCUMENTS 7,640,659 B2 * 1/2010 Karashima et al. ........... 29/846
(Continued)

FOREIGN PATENT DOCUMENTS

JP 1-157796 6/1989
(Continued)

OTHER PUBLICATIONS

Rito, M., et al., "Assembly Process by Electrically Conductive Adhesive Using Low Melting Point Fillers", 9th Symposium on "Microjoining and Assembly Technology in Electronics", Feb. 6-7, 2003, p. 115-120, Yokohama, Japan.

(Continued)

*Primary Examiner* — C. J Arbes
(74) *Attorney, Agent, or Firm* — McDermott Will & Emery LLP

(57) ABSTRACT

In a method for forming bumps 19 on electrodes 32 of a wiring board 31, a fluid 14 containing conductive particles 16 and a gas bubble generating agent is supplied onto a first region 17 including the electrodes 32 on the wiring board 31. Then, a substrate 40 which has a protruding surface 13 having the same area as that of the first region 17 and formed on a main surface 18 of the substrate 40 having a larger area than that of the first region 17 is disposed so that the protruding surface 13 faces the first region 17 of the wiring board 31. Then, the fluid 14 is heated to generate gas bubbles 30 from the gas bubble generating agent contained in the fluid 14.

18 Claims, 27 Drawing Sheets

U.S. PATENT DOCUMENTS

| | | | |
|---|---|---|---|
| 2006/0163744 A1* | 7/2006 | Vanheusden et al. | 257/773 |
| 2007/0096062 A1* | 5/2007 | Kodas et al. | 252/500 |
| 2009/0078746 A1* | 3/2009 | Karashima et al. | 228/248.1 |
| 2009/0133901 A1* | 5/2009 | Karashima et al. | 174/250 |
| 2009/0203170 A1* | 8/2009 | Nakatani et al. | 438/108 |
| 2009/0229120 A1* | 9/2009 | Taniguchi et al. | 29/829 |

FOREIGN PATENT DOCUMENTS

| | | |
|---|---|---|
| JP | 6-125169 | 5/1994 |
| JP | 7-74459 | 3/1995 |
| JP | 2000-94179 | 4/2000 |
| JP | 2002-26070 | 1/2002 |
| JP | 2002-223065 | 9/2002 |
| JP | 2004-260131 | 9/2004 |
| WO | WO 2005/122237 A1 | 12/2005 |
| WO | WO 2006/025387 A1 | 3/2006 |

OTHER PUBLICATIONS

Yasuda, M., et al., "Self-Organized Joining Assembly Process by Electrically Conductive Adhesive Using Low Melting Point Fillers", 10th Symposium on "Microjoining and Assembly Technology in Electronics", Feb. 5-6, 2004, p. 183-188, Yokohama, Japan.

Yasuda, K., et al., "Self-Organized Packaging using Polymer Containing Low-Melting-Point-Metal Filler -Process Simulation of Viscous Multi Phase Flow Fluid-" 11th Symposium on "Microjoining and Assembly Technology in Electronics", Feb. 3-4, 2005, p. 239-244, Yokohama, Japan.

Yamada, T., et al., "Self-organized Packaging by Polymer Containing Low Melting Point Metal -Experimental Verification of Process Rule Factors of Self-organization-", 11th Symposium on "Microjoining and Assembly Technology in Electronics" Feb. 3-4, 2005, p. 245-250, Yokohama, Japan.

* cited by examiner (a)

| CONDUCTIVE PARTICLES | MELTING POINT (SOLIDUS) (° C) |
|---|---|
| Sn-58Bi | 139 |
| Sn-37Pb | 183 |
| Sn-9Zn | 199 |
| Sn-3.0Ag-0.5Cu | 217 |
| Sn-3.5Ag | 221 |
| Sn-0.7Cu | 228 |
| 12Sn-2.0Ag-10Sb-Pb | 240 |

FIG. 26

| GAS BUBBLE GENERATING AGENT | BOILING POINT (° C) | GAS BUBBLE GENERATING AGENT | BOILING POINT (° C) |
|---|---|---|---|
| HEXANE | 69 | DIMETHYLAMINE HYDROCHLORIDE | 171 |
| VINYL ACETATE | 72 | DIMETHYL SULFOXIDE (DMSO) | 189 |
| ISOPROPYL ALCOHOL | 83 | ETHYLENE GLYCOL | 198 |
| WATER | 100 | N-METHYL-2-PYRROLIDONE (NMP) | 204 |
| 1,4-DIOXANE | 101 | $\alpha$-TERPINEOL | 218 |
| BUTYL ACETATE | 126 | BUTYL CARBITOL | 231 |
| PROPIONIC ACID | 141 | BUTYL CARBITOL ACETATE | 246 |

FIG. 27

| BUBBLE GENERATING AGENT | DECOMPOSITION TEMPERATURE (° C) |
|---|---|
| BORIC ACID | 70~ |
| AMMONIUM METABORATE | 120~ |
| SODIUM HYDROGEN CARBONATE | 120-150 |
| 4,4'-OXYBIS (BENZENE SULFONYL HYDRAZIDE) (OBSH) | 155-165 |
| AZODICARBONAMIDE (ADCA) | 197-210 |
| BARIUM METABORATE | 200~ |
| N,N'-DINITROSO PENTAMETHYLENE TETRAMINE (DPT) | 200-250 |
| ALUMINUM HYDROXIDE | 230 |
| CALCIUM ALUMINATE | 230 |
| DAWSONITE | 230 |

(a)

(b)

(a)

(b)

(a)

(b)

(a)

(b)

(a)

(b)

BUMP FORMING METHOD AND BUMP FORMING APPARATUS

RELATED APPLICATIONS

This application is the U.S. National Phase under 35 U.S.C. §371 of International Application No. PCT/JP2007/053866, filed on Feb. 22, 2007, which in turn claims the benefit of Japanese Application Nos. 2006-072316 and 2006-084569, filed on Mar. 16 and Mar. 27, 2006, respectively, the disclosures of which Applications are incorporated by reference herein.

TECHNICAL FIELD

The invention relates to a method for forming bumps on electrodes on a wiring board. The invention also relates to a bump forming apparatus.

BACKGROUND ART

In recent years, as semiconductor integrated circuits (LSIs) used in electronic equipments have become higher in density and degree of integration, electrode terminals of LSI chips have rapidly become higher in pin count and narrower in pitch. In order to mount such an LSI chip on a wiring board, flip chip mounting has been widely used for reduction in wiring delay. In the flip chip mounting, it is typical to form solder bumps on electrode terminals of an LSI chip and simultaneously bond the electrode terminals to electrodes formed on a wiring board via the solder bumps.

Conventionally, a plating method, a screen printing method, and the like have been developed as bump forming techniques. The plating method is suitable for a narrow pitch, but has a problem in productivity because of complicated process steps. The screen printing method is excellent in productivity, but is not suitable for a narrow pitch because of the use of a mask.

In such a situation, several techniques of selectively forming solder bumps on electrodes of an LSI chip and a wiring board have been developed recently. These techniques are not only suitable for formation of micro-bumps but also capable of simultaneously forming the bumps and therefore are also excellent in productivity. These techniques have thus drawn attention as techniques applicable to mounting of a next-generation LSI on a wiring board.

One of these techniques is a technique called a solder paste method (for example, Patent document 1). In this technique, a solder paste made of a mixture of solder powder and flux is solidly applied on a substrate having electrodes formed on a surface thereof, and the solder powder is melted by heating the substrate, whereby solder bumps are selectively formed on the electrodes having high wettability.

In a technique called a super solder method (for example, Patent document 2), a paste-like composition (a chemical reaction deposition-type solder) containing an organic acid lead salt and metallic tin as main components is solidly applied on a substrate having electrodes formed thereon, and a substitution reaction between Pb and Sn is caused by heating the substrate, whereby a Pb/Sn alloy is selectively deposited on the electrodes of the substrate.

In a technique called a super juffit method (for example, see Patent document 3), a substrate having electrodes formed on a surface thereof is immersed in an agent to form an adhesive coating only on the surfaces of the electrodes, the adhesive coating thus formed is brought into contact with a solder powder so that the solder powder adheres to the electrodes, and the substrate is then heated, whereby the melted solder is selectively formed on the electrodes.

Patent document 1: Japanese Laid-Open Patent Publication No. 2000-94179
Patent document 2: Japanese Laid-Open Patent Publication No. HEI 1-157796
Patent document 3: Japanese Laid-Open Patent Publication No. HEI 7-74459

DISCLOSURE OF THE INVENTION

Problems to be Solved by the Invention

The above-described solder paste methods were originally developed as a technique of selectively pre-coating solder on electrodes formed on a substrate, and have the following problems for application to bump formation required for flip chip mounting.

In the solder paste methods, a paste-like composition is supplied onto the substrate by coating, thereby causing local variations in thickness and concentration. Accordingly, the deposition amount of solder varies in each electrode and it is difficult to obtain uniform bumps. Moreover, in these methods, the paste-like composition is supplied by coating onto an uneven wiring board having electrodes formed on a surface thereof. It is therefore difficult to stably supply a sufficient amount of solder onto the electrodes that form projecting portions.

Moreover, the chemical reaction deposition-type solder material used in the super solder method uses a specific chemical reaction. Therefore, this method has a low degree of freedom in selection of solder composition and still has a problem with going to Pb-free.

On the other hand, the super juffit method is excellent in the following points: since the solder powder uniformly adheres to the electrodes, uniform bumps can be obtained; and because of a high degree of freedom in selection of solder composition, the method can easily go to Pb-free. However, the process of selectively forming an adhesive coating on the electrode surfaces, which is an essential process of the super juffit method, requires a special agent processing using a chemical reaction. This complicates the process and causes increase in cost. Therefore, this method still has a problem with application to a mass-production process.

The bump forming techniques, not only widely used techniques such as a plating method and a screen printing method but newly developed techniques, thus have problems. The inventors of the present application thought that developing a novel bump forming method regardless of the existing bump forming techniques eventually leads to a highly potential technique and carried on research and development.

The invention is made in view of the above problems and it is an object of the invention to provide a bump forming method and a bump forming apparatus which are excellent in productivity.

Means for Solving the Problems

A bump forming method according to the invention is a method for forming bumps on electrodes of a wiring board and is characterized in that the method includes the steps of: (a) supplying a fluid containing conductive particles and a gas bubble generating agent onto a first region including the electrodes on the wiring board; (b) disposing a substrate having a protruding surface formed on a main surface thereof so that the protruding surface faces the first region of the wiring board; (c) heating the fluid to generate gas bubbles from the gas bubble generating agent contained in the fluid; and (d) heating the fluid to melt the conductive particles contained in the fluid, wherein in the step (c), the fluid is self-assembled on the electrodes by the gas bubbles generated from the gas bubble generating agent, and in the step (d), the conductive particles contained in the fluid self-assembled on the electrodes are melted to form the bumps on the electrodes.

Another bump forming method according to the invention is a method for forming bumps on electrodes of a wiring board and is characterized in that the method includes the steps of: (a) supplying a fluid containing conductive particles and a gas bubble generating agent onto a first region including the electrodes on a part of the wiring board; (b) disposing a substrate having a recess formed on a main surface thereof so that the recess surrounds the first region of the wiring board; (c) heating the fluid to generate gas bubbles from the gas bubble generating agent contained in the fluid; and (d) heating the fluid to melt the conductive particles contained in the fluid, wherein in the step (c), the fluid is self-assembled on the electrodes by the gas bubbles generated from the gas bubble generating agent, and in the step (d), the conductive particles contained in the fluid self-assembled on the electrodes are melted to form the bumps on the electrodes.

A bump forming apparatus according to the invention is an apparatus for forming bumps on electrodes of a wiring board by the above bump forming method and is characterized in that the apparatus includes: a stage on which the wiring board is to be placed; a header for holding a substrate having a protruding surface or a recess formed on a main surface thereof; and a heating means for heating the stage or the header, wherein a fluid containing conductive particles and a gas bubble generating agent is supplied onto a first region including the electrodes on the wiring board placed on the stage, the substrate held by the header is disposed so that the protruding surface faces the first region of the wiring board or so that the recess surrounds the first region of the wiring board, the fluid is heated by the heating means so that the fluid is self-assembled on the electrodes by gas bubbles generated from the gas bubble generating agent contained in the fluid, and the fluid is further heated by the heating means so that the conductive particles contained in the fluid self-assembled on the electrodes are melted to form the bumps on the electrodes.

Another bump forming apparatus according to the invention is a bump forming apparatus for forming bumps on electrodes of a wiring board and is characterized in that the apparatus includes: a stage on which the wiring board is to be placed; a header for holding a plate-like member disposed so as to face the stage; and a heating means for heating the stage or the header, wherein the header has a means capable of moving in an up-down direction with respect to the stage, a fluid containing conductive particles and a gas bubble generating agent is supplied onto the wiring board placed on the stage, the plate-like member held by the header is placed so as to abut on the fluid supplied onto the wiring board, the fluid is heated by the heating means so that the fluid is self-assembled on the electrodes by gas bubbles generated from the gas bubble generating agent contained in the fluid, and the fluid is further heated by the heating means so that the conductive particles contained in the fluid self-assembled on the electrodes are melted to form the bumps on the electrodes.

EFFECTS OF THE INVENTION

According to the bump forming method of the invention, a fluid containing conductive particles and a gas bubble generating agent is supplied onto a first region including electrodes on a wiring board, and a substrate having a protruding surface formed thereon is then disposed so that the protruding surface faces the first region of the wiring board. The fluid is then heated to generate gas bubbles from the gas bubble generating agent. Therefore, bumps can be selectively formed in the first region. Especially by generating gas bubbles from the gas bubble generating agent by heating the fluid, the conductive particles can be self-assembled on the electrodes. As a result, a highly productive bump forming method can be provided.

BRIEF DESCRIPTION OF THE DRAWINGS

FIG. 25 is a diagram showing materials of conductive particles according to an embodiment of the invention;

FIG. 26 is a diagram showing materials of a gas bubble generating agent according to an embodiment of the invention;

FIG. 27 is a diagram showing materials of a gas bubble generating agent according to an embodiment of the invention;

Figure 1:
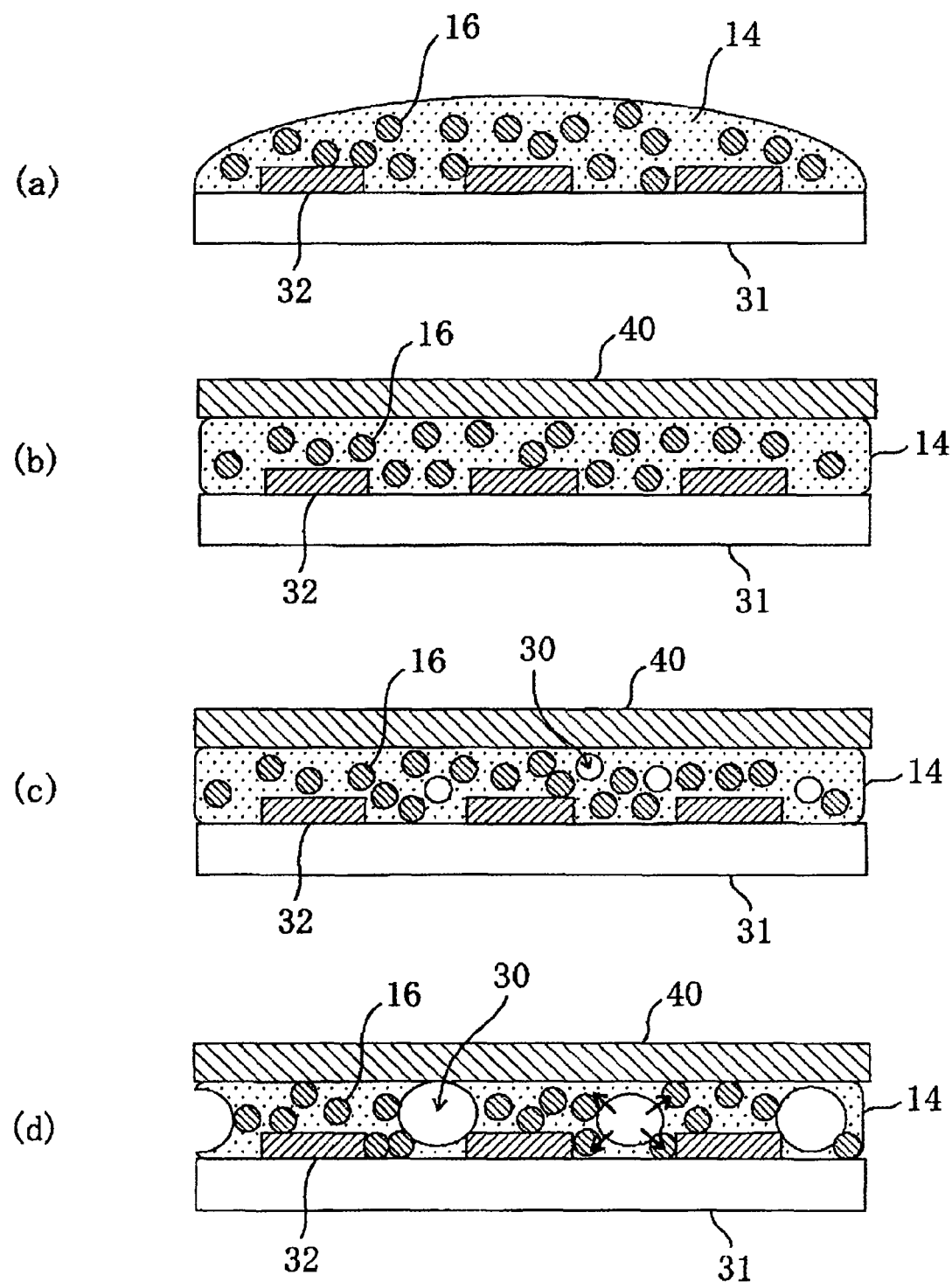
FIGS. 1(a) through 1(d) are process cross-sectional views showing a basic process of a bump forming method using self-assembly of a resin.

DESCRIPTION OF THE REFERENCE NUMERALS 13 protruding surface
14 fluid (resin)
16 conductive particle (solder powder)
17 first region
18 main surface
19 bump
20 recess (groove)
30 gas bubble
31 wiring board
32 electrode
40 substrate (plate-like member)
41 electrode pattern
50 stage
52 header
53 sucking means
60 heating means (heater)
70 dispenser
72 needle member
74 squeegee
75 blade device
80 washing device
100 bump forming apparatus

BEST MODE FOR CARRYING OUT THE INVENTION

The applicant of the present application has suggested a novel bump forming method and a novel flip chip mounting method (Japanese Patent Application Nos. 2004-257206, 2004-365684, and 2005-094232) after making various studies of a bump forming method for forming bumps by self-assembling conductive particles (for example, solder powder) on electrodes of a wiring board, semiconductor chip, or the like, or a flip chip mounting method for performing flip chip mounting by self-assembling conductive particles between respective electrodes of a wiring board and a semiconductor chip and forming a connection body between the electrodes. Note that these patent applications are herein incorporated by reference.

FIGS. 1(a) to 1(d) and FIGS. 2(a) to 2(d) are diagrams illustrating a basic process of a bump forming method disclosed by the applicant of the present application in the specifications of the above patent applications.

First, as shown in FIG. 1(a), a resin 14 containing solder powder 16 and a gas bubble generating agent (not shown) is supplied onto a wiring board 31 having a plurality of electrodes 32. Then, as shown in FIG. 1(b), a substrate 40 is placed on a surface of the resin 14.

By heating the resin 14 in this state, as shown in FIG. 1(c), gas bubbles 30 are generated from the gas bubble generating agent contained in the resin 14. Then, as shown in FIG. 1(d), the resin 14 is pushed outside the gas bubbles 30 by growth of the generated gas bubbles 30.

Figure 2:
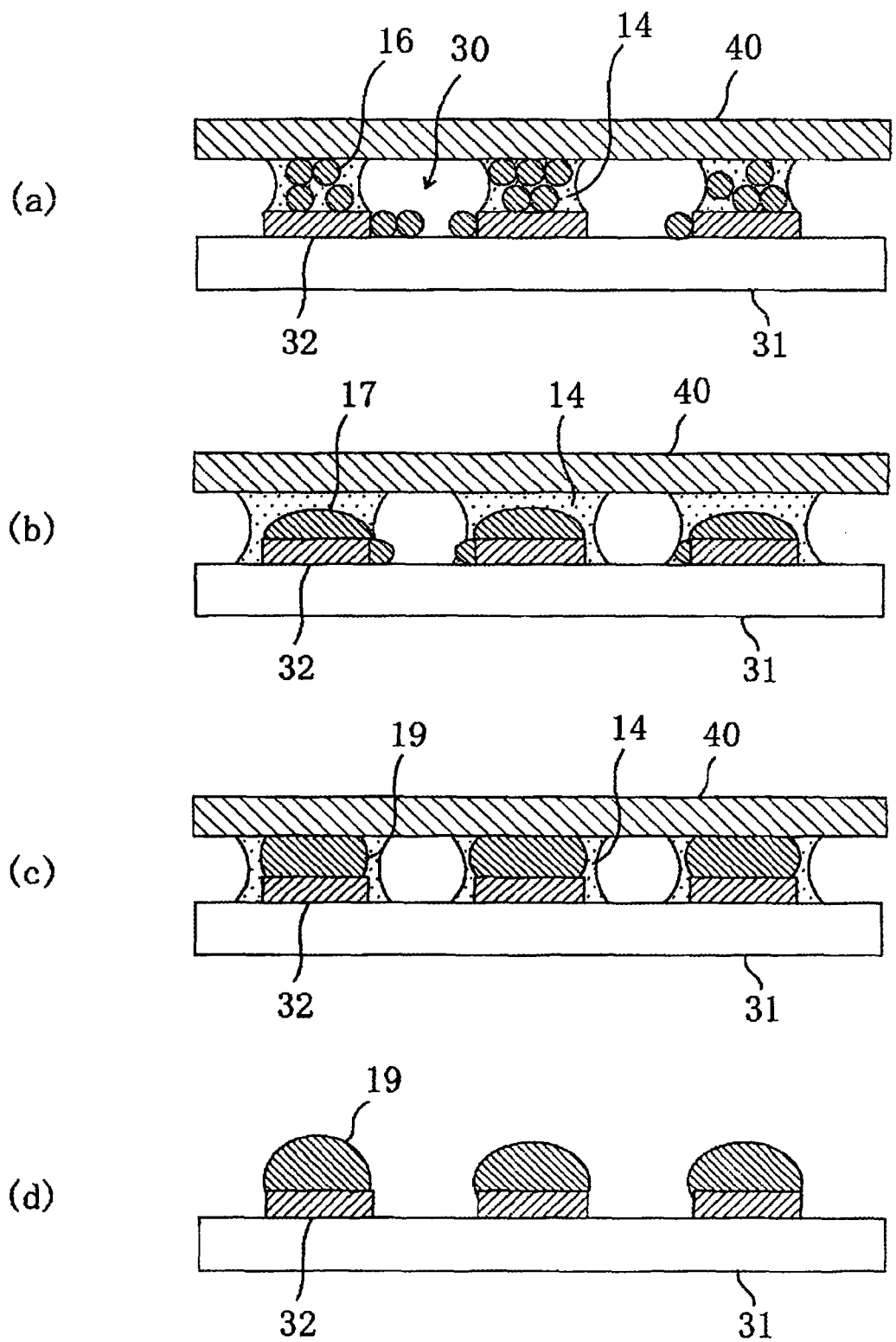
FIGS. 2(a) through 2(d) are process cross-sectional views showing a basic process of a bump forming method using self-assembly of a resin.

As shown in FIG. 2(a), the resin 14 thus pushed out is self-assembled into a columnar shape at the interface with the electrodes 32 of the wiring board 31 and the interface with the substrate 40. Then, by further heating the resin 14, as shown in FIG. 2(b), the solder powder 16 contained in the resin 14 is melted, whereby particles of the solder powder 16 contained in the resin 14 self-assembled on the electrodes 32 are melt-bonded together.

Since the electrodes 32 have high wettability to the melt-bonded solder powder 16, bumps 19 made of molten solder powder are formed on the electrodes 32 as shown in FIG. 2(c). Finally, as shown in FIG. 2(d), the resin 14 and the substrate 40 are removed, whereby the wiring board 31 having the bumps 19 formed on the electrodes 32 is obtained.

This method is characterized in that, by heating the resin 14 supplied to the space between the wiring board 31 and the substrate 40, gas bubbles 30 are generated from the gas bubble generating agent, and the resin 14 is pushed outside the gas bubbles 30 by the growth thereof so that the resin 14 is self-assembled between the electrodes 32 of the wiring board 31 and the substrate 40.

Figure 3:
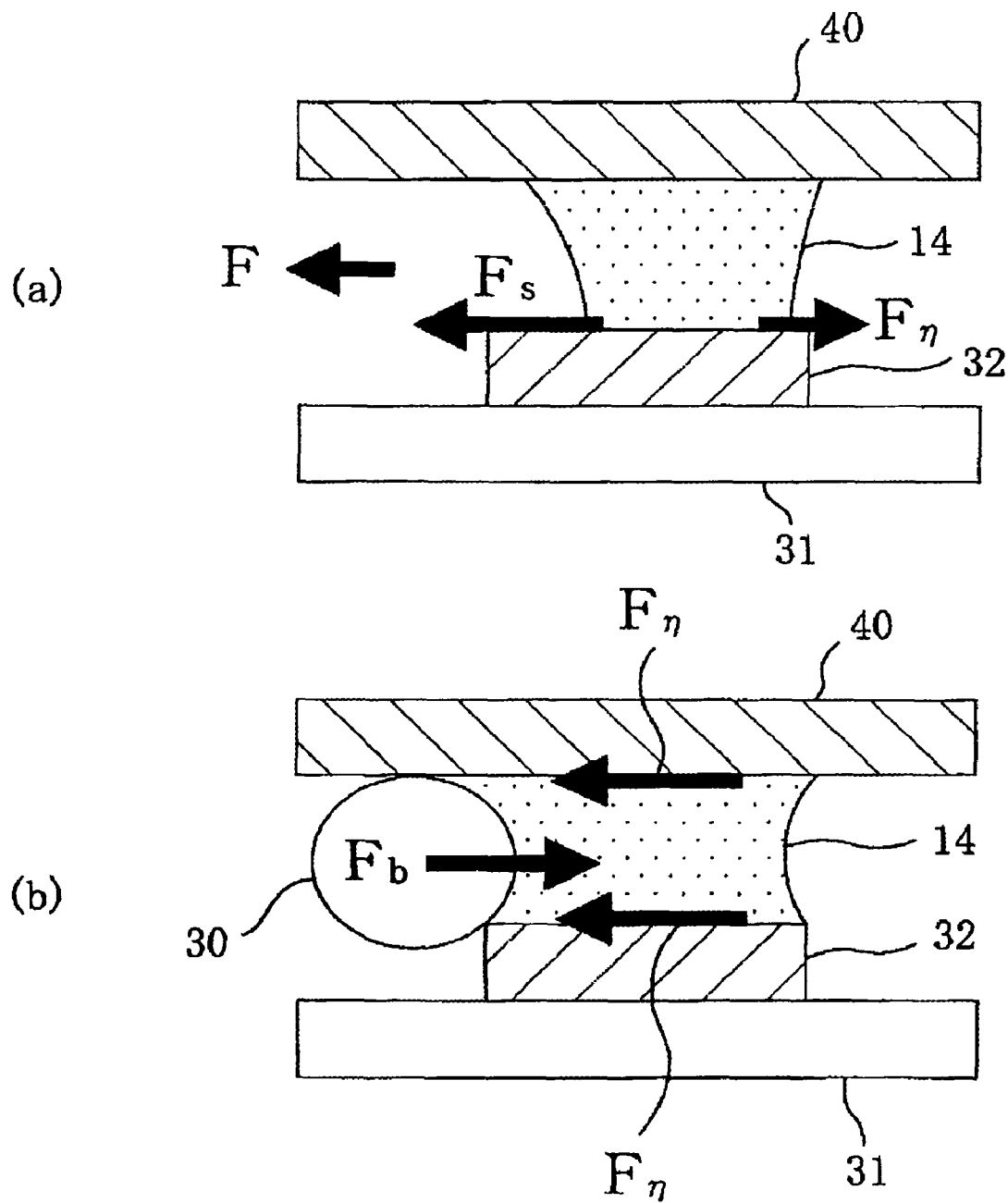
FIGS. 3(a) and 3(b) are diagrams illustrating a mechanism of self-assembly of a resin.

It can be considered that the phenomenon that the resin 14 is self-assembled on the electrodes 32 is caused by the mechanism shown in FIGS. 3(a) and 3(b).

FIG. 3(a) is a diagram showing the state of the resin 14 pushed onto an electrode 32 of the wiring board 31 by the grown gas bubbles (not shown). The resin 14 that is in contact with the electrode 32 has a larger interfacial tension (a force resulting from so-called wet-spreading of a resin) Fs at the interface therebetween than a stress $F\eta$ generated from the viscosity $\eta$ of the resin. Therefore, the resin 14 spreads over the whole surface of the electrode 32, and a columnar resin having boundaries at the ends of the electrode 32 is finally formed between the electrode 32 and the substrate 40.

Note that, as shown in FIG. 3(b), a stress Fb generated by the growth (or movement) of the gas bubbles 30 is applied to the columnar resin 14 formed by self-assembly on the electrode 30. However, the columnar resin 14 can retain its shape by the stress $F\eta$ generated by the viscosity $\eta$ of the resin 14. Therefore, the resin 14 once self-assembled does not disappear.

Whether the self-assembled resin 14 can retain a constant shape or not depends not only on the above interfacial tension Fs but on the area S of the electrode 32 and the distance L of the space between the electrode 32 and the substrate 40, and the viscosity η of the resin 14. Provided that T is a reference value that enables the resin 14 to retain a constant shape, the following relation is considered to be satisfied qualitatively:

$$T=K \cdot (S/L) \cdot \eta \cdot Fs (K \text{ is a constant}).$$

As described above, this method forms the resin 14 on the electrodes 32 in a self-aligned manner by using self-assembly of the resin 14 by the interfacial tension. However, since the electrodes 32 are formed as protrusions on the surface of the wiring board 31, it can be said that such self-assembly by the interfacial tension uses a phenomenon that occurs on the electrodes 32 where the gap between the wiring board 31 and the substrate 40 is narrowed.

By using the above method proposed by the applicant of the present application, the solder powder dispersed in the resin can be efficiently self-assembled on the electrodes, and uniform, highly productive bump formation can be implemented. Moreover, since the solder powder dispersed in the resin can be equally self-assembled on the plurality of electrodes on the substrate having the resin supplied thereon. Therefore, the above method is especially useful when bumps are simultaneously formed on all the electrodes on the wiring board having the resin supplied thereon.

During further study of the above method, the applicant of the present application observed a certain phenomenon when forming bumps on a partial region of a wiring board. This phenomenon will now be described.

Depending on the structure of the wiring board, bumps may need to be formed only on the electrodes on a part of the wiring board. For example, FIG. 4 shows a case of forming bumps on the electrode 32 that are the tips of wirings.

Figure 4:
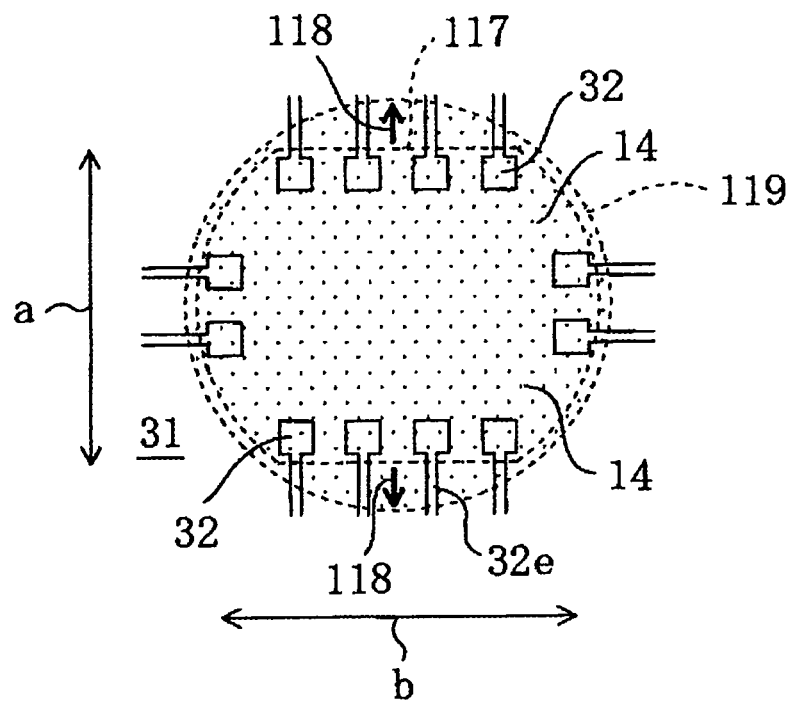
FIG. 4 is a diagram illustrating a resin moving means in bump formation.

In the case of the wiring board of FIG. 4, a resin 14 containing solder powder and a gas bubble generating agent (not shown) is applied to a region 117 including electrodes 32. By heating the applied resin 14, bumps are formed on the electrodes 32 in the region 117 in a self-assembled manner. In this case, however, as shown in FIG. 4, a phenomenon was found that the resin 14 and the solder powder move to a region 119 other than the resin 117 and the solder wet-spreads not only in the range of the electrodes 32 but in the range of wirings 32e to form assembly of the solder powder on the wirings 32e. There was also a case in which the solder powder was deviated assembled due to a slight difference in balance. Note that, in FIG. 4, dimension a is about 1 mm and dimension b is about 1.25 mm.

Figure 5:
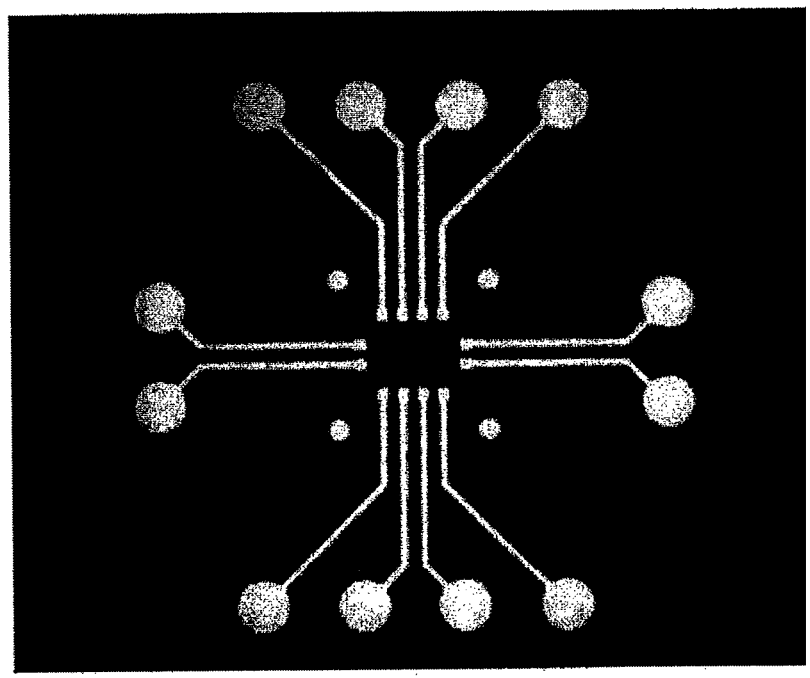
FIG. 5 is a microphotograph illustrating a wiring pattern in an example of performing bump formation in a partial region.
Figure 6:
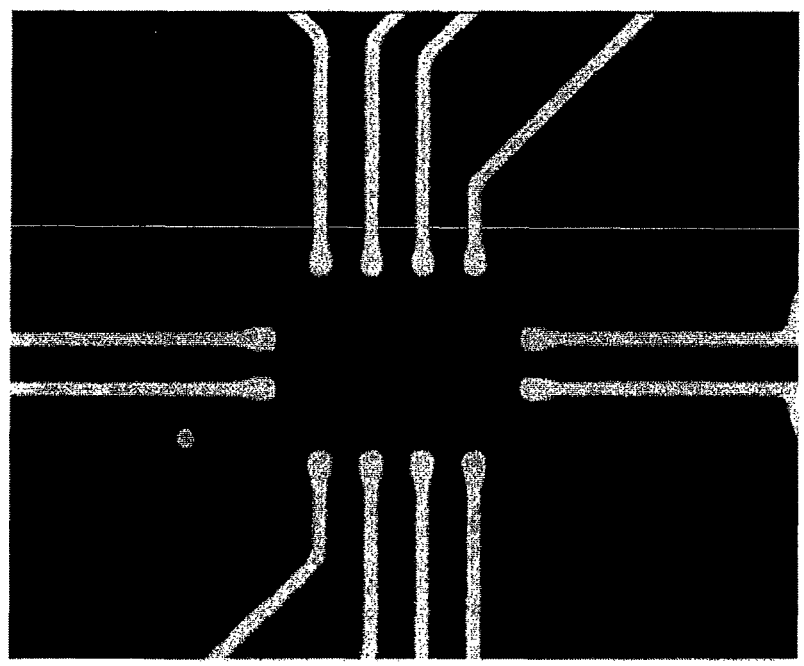
FIG. 6 is a microphotograph illustrating a wiring pattern in an example of performing bump formation in a partial region.

Moreover, description will be given to the case where bumps are to be formed on twelve electrodes (lands) in the center of a wiring pattern as shown in FIG. 5. Note that FIG. 6 shows another example of the wiring pattern having a central portion shown in FIG. 5.

Figure 7:
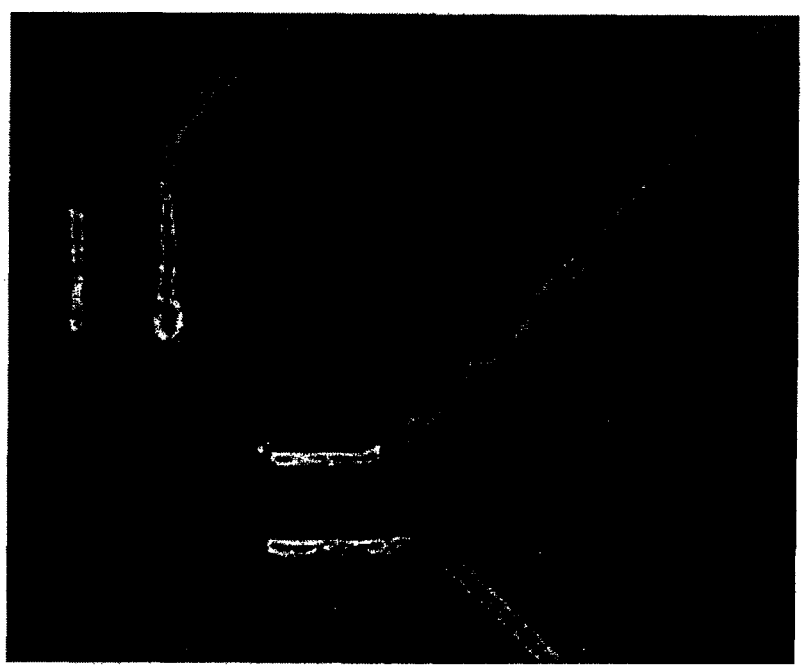
FIG. 7 is a microphotograph illustrating an example in which movement of a resin was observed.
Figure 8:
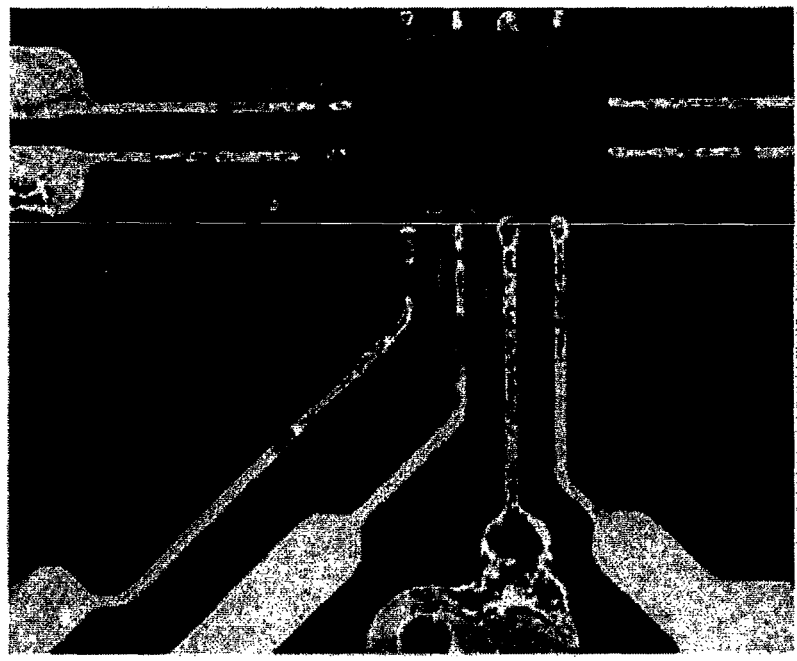
FIG. 8 is a microphotograph illustrating an example in which movement of a resin was observed.
Figure 9:
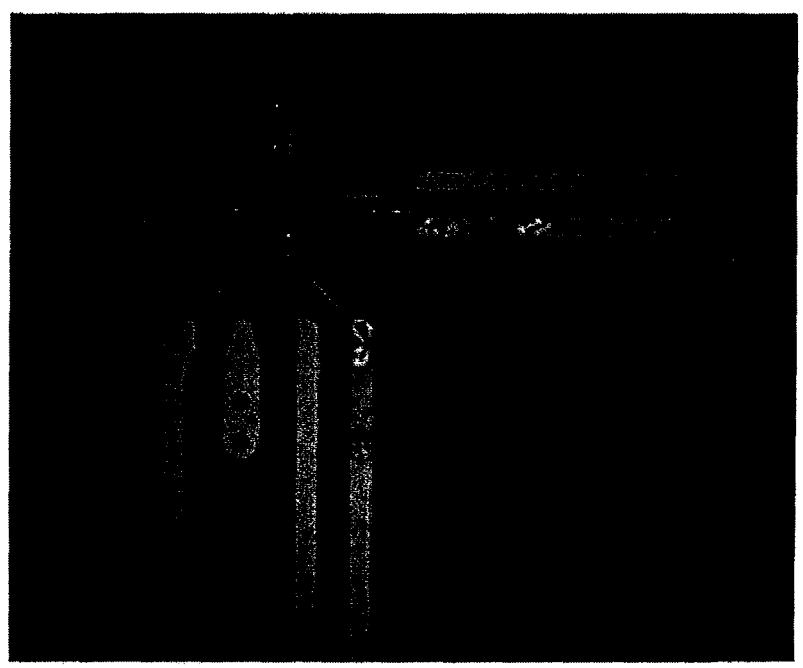
FIG. 9 is a microphotograph illustrating an example in which movement of a resin was observed.
Figure 10:
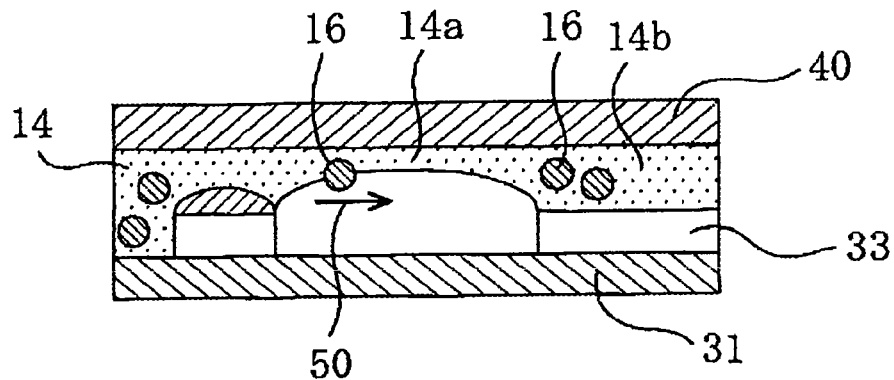
FIG. 10 is a diagram illustrating a resin moving means in bump formation.

In this case, the inventors of the present application observed the following phenomenon: first, as shown in FIG. 7, there was an example in which a solder bump spread beyond a land portion. As shown in FIGS. 8 and 9, there was also an example in which solder powder was assembled at a position that does not relate to the land portion. Such assembly of the solder powder at an unrelated position occurred probably based on the following movement of the resin 14: as shown in FIG. 10, the resin 14 moved along the substrate 40 to another location (see resin 14a, 14b and arrow 50) and the solder powder 16 moved onto an electrode 33 on which bump formation was not intended. A phenomenon that the resin flowed between wirings to a distant place and the solder powder moved accordingly was observed in some cases.

It is possible to find such bump formation conditions that can limit movement of the resin 14 within a predetermined region on a case-by-case basis by experiments or the like and strictly control the conditions, or to mask the substrate other than a predetermined region. However, both methods impair the simplicity of the above bump forming method.

The inventors of the present application arrived at the invention after keenly studying a method capable of forming solder bumps in a simple manner not only when the fluid (resin) 14 containing the solder powder 16 and the gas bubble generating agent is applied to the whole surface of the wiring board but when this fluid 14 is applied to a partial region of the wiring board.

Hereinafter, embodiments of the invention will be described with reference to the accompanying drawings. For simplification of description, elements having substantially the same function are denoted by the same reference numerals and characters throughout the figures shown below. The invention is not limited to the embodiments below.

FIGS. 11(a) to 11(c) are process cross-sectional views illustrating a bump forming method according to an embodiment of the invention.

First, as shown in FIG. 11(a), a fluid 14 containing conductive particles 16 and a gas bubble generating agent (not shown) is supplied onto a first region 17 including electrodes 32 on a wiring board 31. In this embodiment, the fluid 14 is a resin. Note that specific examples of the conductive particles 16 and the gas bubble generating agent will be described later.

The first region 17 is often a partial region of the wiring board 31, but may be the whole (or approximately the whole) region of the wiring board 31. Note that the first region 17 is typically a region that is the same as or slightly larger than a region where bumps are to be formed. The first region 17 typically corresponds to the region where bumps are to be formed, and the fluid 14 is supplied to the first region 17. Therefore, the first region 17 is not limited by the area, shape, and the like, but is determined by the wiring pattern and electrode (land) layout. In the case where the region 117 shown in FIG. 4 corresponds to the first region 17 of this embodiment, the first region 17 is a region corresponding to dimension a by dimension b, for example, a region of 1 mm by 1.25 mm or the area about the same as 1 mm by 1.25 mm.

Then, as shown in FIG. 11(b), a substrate (plate-like member) 40, which has a protruding surface 13 having the same area as that of the first region 17 and formed on a main surface 18, is disposed on the fluid 14. More specifically, the substrate 40 is disposed on the fluid 14 so that the protruding surface 13 of the substrate 40 faces the first region 17 of the wiring board 31. The dimensions and shape of the substrate 40 and the dimensions, height (13h) and shape of the protruding surface 13 can be specifically determined on a case-by-case basis according to the bump formation conditions. Note that, in one example of this embodiment, the substrate 40 has a 1 cm by 1 cm square shape, and the protruding surface 13 has a 4 mm by 4 mm square shape with a height (13h) of 400 μm. It should be noted that this example is exemplary only and the invention is not limited to the above dimensions and shape.

The substrate (plate-like member) 40 is, for example, a glass substrate. Not only the glass substrate, but a ceramic substrate or a semiconductor substrate (such as a silicon substrate) may be used. Using a light-transmitting substrate as the substrate 40 is advantageous in that confirmation of the progress of a process and bump formation is facilitated. It is also preferable to use a substrate having excellent flatness and capable of being easily processed (for example, a glass substrate) as the substrate 40. It should be understood that the more inexpensive the substrate 40 is, the more advantageous it becomes in terms of the cost of the manufacturing process.

Figure 11:
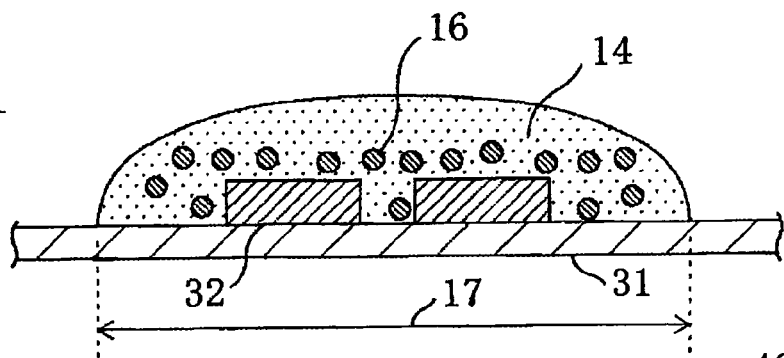
FIGS. 11(a) through 11(c) are process cross-sectional views showing a bump forming method according to an embodiment of the invention.
Figure 11:
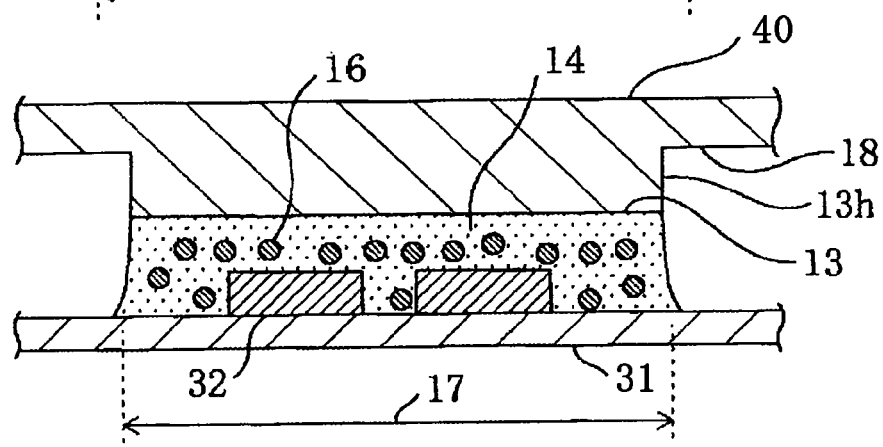
Figure 11:
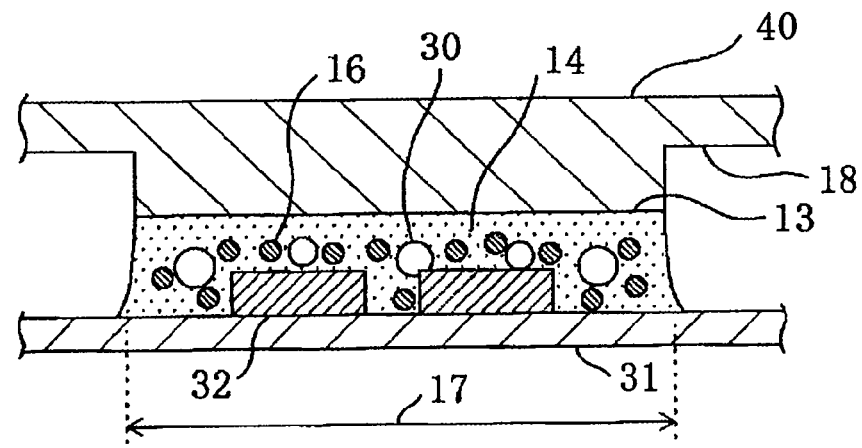

By heating the fluid 14 in the state shown in FIG. 11(*b*), gas bubbles 30 are generated from the gas bubble generating agent contained in the fluid 14, as shown in FIG. 11(*c*). In this embodiment, the fluid 14 is heated while having the protruding surface 13 of the substrate 40 abut on the fluid 14. Moreover, a prescribed space is provided between the electrodes 32 formed on the wiring board 31 and the protruding surface 13 of the substrate 40, and this prescribed space is larger than the particle size of the conductive particles 16. In addition, the substrate 40 is fixed or held and the fluid is heated.

As shown in FIGS. 11(*b*) and 11(*c*), since the protruding surface 13 is formed on the substrate 40, the fluid 14 supplied to the first region 17 can be retained in the first region 17 by the surface tension between the fluid 14 and the protruding surface 13. In other words, since the fluid 14 is retained in the first region 17, the fluid 14 does not spread largely beyond the first region 17. As a result, an effective process capable of conducting local bump formation in a simple manner is implemented.

Hereinafter, a process after generation of the gas bubbles 30 will be described with reference to FIGS. 12(*a*) through 12(*d*).

Figure 12:
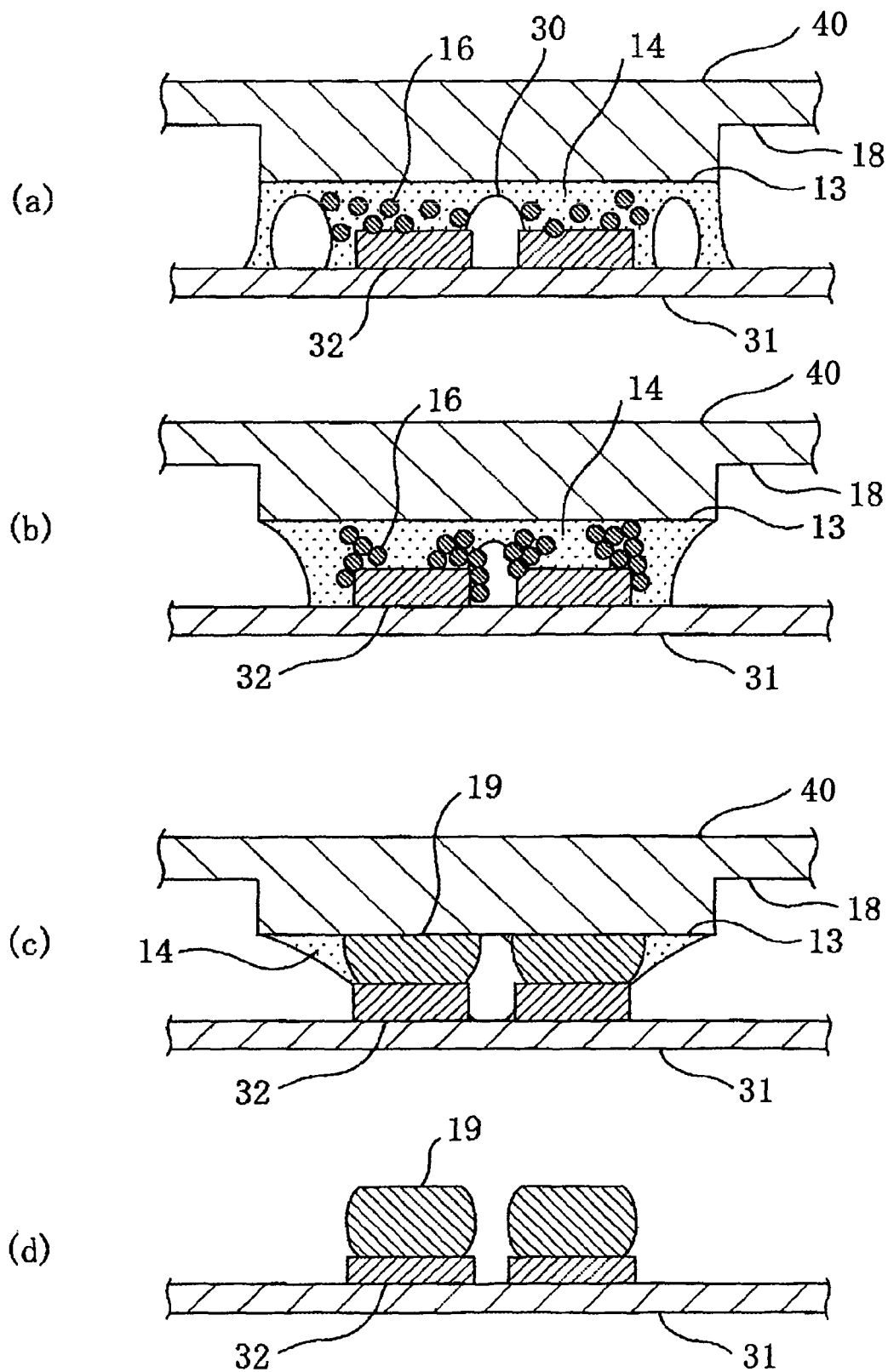
FIGS. 12(a) through 12(d) are process cross-sectional views showing a bump forming method according to an embodiment of the invention.

As shown in FIG. 12(*a*), the fluid 14 is pushed out by the gas bubbles 30 as the generated gas bubbles 30 grow. Note that the gas bubbles 30 generated from the gas bubble generating agent in the fluid 14 are discharged to the outside from a periphery of the space provided between the substrate 40 and the wiring board 31.

As shown in FIG. 12(*b*), the fluid 14 thus pushed out assembles into a columnar shape at the interface with the electrodes 32 of the wiring board 31 and the interface with the protruding surface 13 of the substrate 40. The conductive particles 16 in the fluid 14 assemble onto the electrodes 32 accordingly.

Then, by further heating the fluid 14, as shown in FIG. 12(*c*), the conductive particles 16 contained in the fluid 14 are melted, whereby self-assembly of the conductive particles 16 is completed. In other words, bumps 19 made of the melted conductive particles are formed on the electrodes 32.

After the bumps are formed, by moving the substrate 40 in an up-down direction by an appropriate amount, variation in height of the formed bumps can be suppressed. This can improve parallelism upon, for example, metal bonding in the flip chip mounting conducted after bump formation, whereby connection reliability can be improved.

Finally, as shown in FIG. 12(*d*), the substrate 40 is removed, whereby the wiring board 31 having the bumps 19 formed on the electrodes 32 is obtained. The fluid 14 may also be removed together with the removal of the substrate 40.

Note that the fluid (resin) 14 may be left after the substrate 40 is removed. After the bumps are formed, however, fine conductive particles (solder powder) may remain on the fluid 14 as a residue. Therefore, it is also preferable in view of reliability to remove the fluid 14 together with the residue, as shown in FIG. 12(*d*).

In the bump forming method of this embodiment, the protruding surface 13 is placed on the surface of the fluid 14 supplied onto the first region 17 so as to face the first region 17. Therefore, the fluid 14 can be retained on the first region 17 by the surface tension. Accordingly, when the fluid 14 is heated and the gas bubbles 30 are generated from the gas bubble generating agent, the fluid 14 can be prevented from moving beyond the first region 17 to a region other than the first region 17. As a result, when the bumps 19 are to be selectively formed within the first region 17, it is not necessary to remove afterward the solder powder 16 moved to a region other than the first region 17 and to provide a mask in advance. As a result, the bumps can be reliably selectively formed by a simple method. Moreover, since the fluid 14 can be actively retained within the first region 17 by the surface tension, conditions for selectively forming the bumps 19 within the first region 17 are relaxed, and the degree of freedom of the process conditions is increased.

Moreover, in the method of this embodiment, the fluid 14 is pushed outside the gas bubbles by the growth of the gas bubbles 30, whereby the fluid 14 can be self-assembled on the electrodes 32 on the first region 17. Thereafter, by melting the conductive particles 16 contained in the fluid 14 self-assembled on the electrodes 32, the bumps 19 made of the melted conductive particles can be formed on the highly wettable electrodes 32 in a self-aligned manner. In this way, the conductive particles 16 dispersed in the fluid 14 can be efficiently self-assembled on the electrodes 32, whereby bumps having excellent uniformity and high productivity can be formed on the electrodes.

Figure 13:
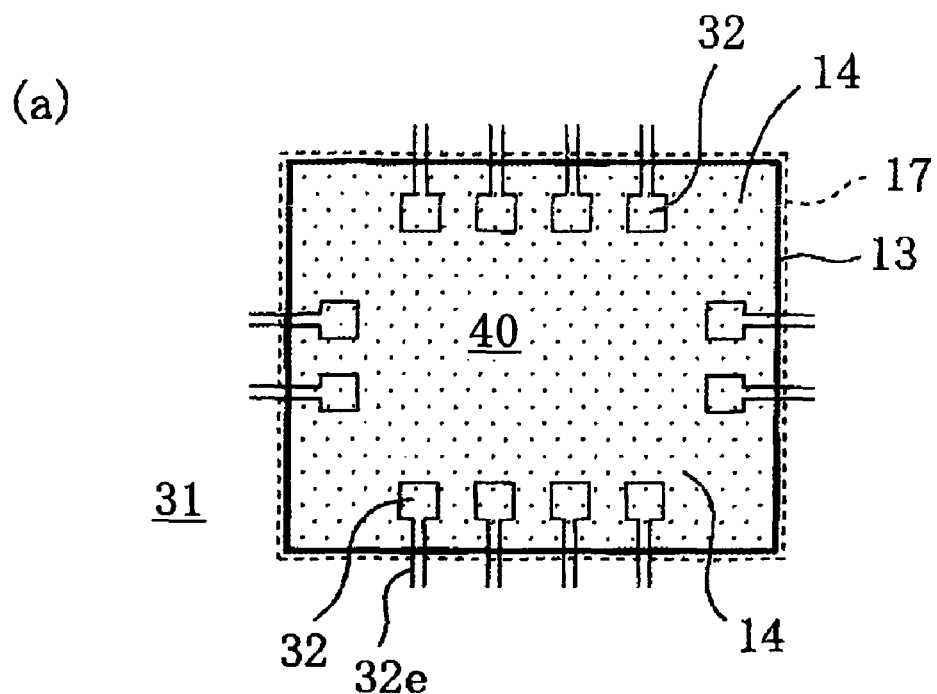
FIGS. 13(a) and 13(b) are a process top view and a process cross-sectional view showing a bump forming method according to an embodiment of the invention, respectively.
Figure 13:
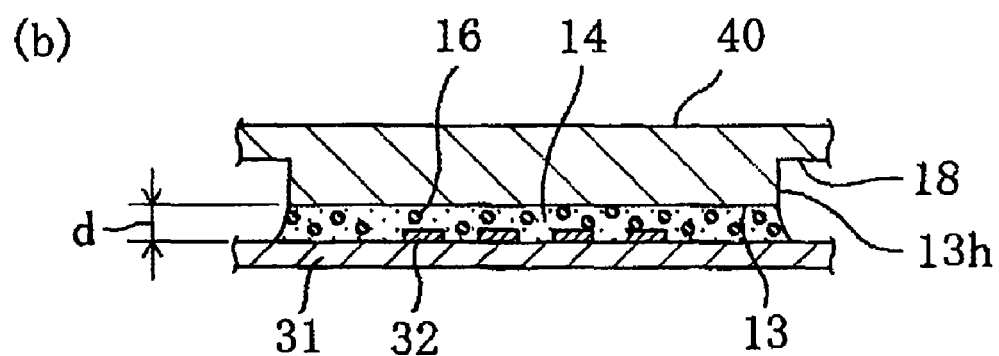

When the state shown in FIG. 11(*b*) is applied to the wiring board including the same electrodes 32 as those shown in FIG. 4, the state shown in FIGS. 13(*a*) and 13(*b*) is obtained. FIG. 13(*a*) is a top view corresponding to FIG. 4, and FIG. 13(*b*) is a cross-sectional (side) view corresponding to FIG. 11(*b*).

As can be seen from FIGS. 13(*a*) and 13(*b*), in the structure of this embodiment, the fluid 14 can be retained in the first region 17 by the protruding surface 13 of the substrate 40. Therefore, unlike the example shown in FIG. 4, the bumps 19 will be reliably formed on the electrodes (lands) 32 in a self-assembled manner. In other words, in the structure of this embodiment, the fluid 14 is retained within the first region 17 by the surface tension of the protruding surface 13. Therefore, the conductive particles can be prevented from assembling to the locations of wirings 32*e* and a part of an electrode pattern in a region other than the first region 17, and short-circuit can thus be prevented from being caused by such assembling of the conductive particles.

Note that, in the above embodiment, the substrate 40 is disposed after the fluid 14 is supplied onto the wiring board 31. However, the invention is not limited to this. Alternatively, the first region 17 and the protruding surface 13 may first be disposed so as to face each other with a prescribed space therebetween, and then the fluid 14 containing the conductive particles 16 and the gas bubble generating agent may be supplied to this space.

As described above, in the method of this embodiment, the fluid 14 containing the conductive particles 16 is pushed outside the gas bubbles by the growth of the gas bubbles 30, whereby the fluid 14 is assembled into a columnar shape on the electrodes 32. By melting the conductive particles 16 contained in the assembled fluid 14, the bumps 19 made of the melted conductive particles 16 can be formed on the electrodes 32 in a self-aligned manner.

Accordingly, even in the case where self-assembly on the electrodes could not be successfully implemented by merely using wettability, the bumps 19 made of the melted conductive particles 16 can be formed on the electrodes 32 in a self-assembled manner by the method of this embodiment. Moreover, since the conductive particles 16 can be efficiently self-assembled on the electrodes 32, required bumps 19 can be formed on the electrodes 32 with an appropriate amount of conductive particles 16 without having an excessive amount of conductive particles 16 contained in the fluid 14. Note that an optimal content of conductive particles 16 can be set, for example, as follows:

Provided that all the conductive particles 16 contained in the volume (VB) of the fluid (for example, resin) 14 supplied onto the wiring board 31 contribute to formation of the bumps 19 on the electrodes 32 of the wiring board 31, the relation between the total volume (VA) of the bumps 19 and the volume (VB) of the fluid 14 is shown by the following formula (1):

$$VA:VB \approx SA:SB \quad (1).$$

In this formula, SA indicates the total area of the electrodes 32 on the wiring board 31 and SB indicates the area of a predetermined region (more specifically, the above-described first region 17) of the wiring board 31. The content of conductive particles 16 in the resin 14 can thus be shown by the following formula (2):

$$\text{(The content of conductive particles 16)} = SA/SB \times 100 \text{ [volume \%]} \quad (2).$$

Accordingly, the optimal content of conductive particles 16 in the resin 14 can be generally set based on the following formula (3):

$$\text{(The content of conductive particles 16)} = SA/SB \times 100 \pm a \text{ [volume \%]} \quad (3).$$

Note that the above parameter (±a) is provided to adjust the excess and shortage at the time the conductive particles 16 are self-assembled on the electrodes 32 of the wiring board 31, and can be determined by various conditions.

Figure 14:
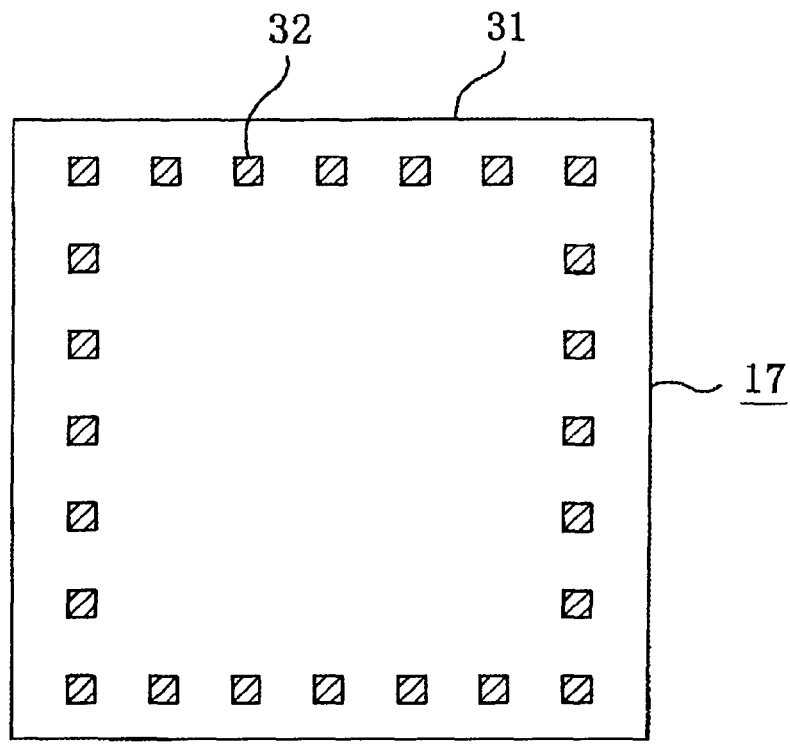
FIG. 14 is a plan view showing peripheral arrangement of electrodes.
Figure 15:
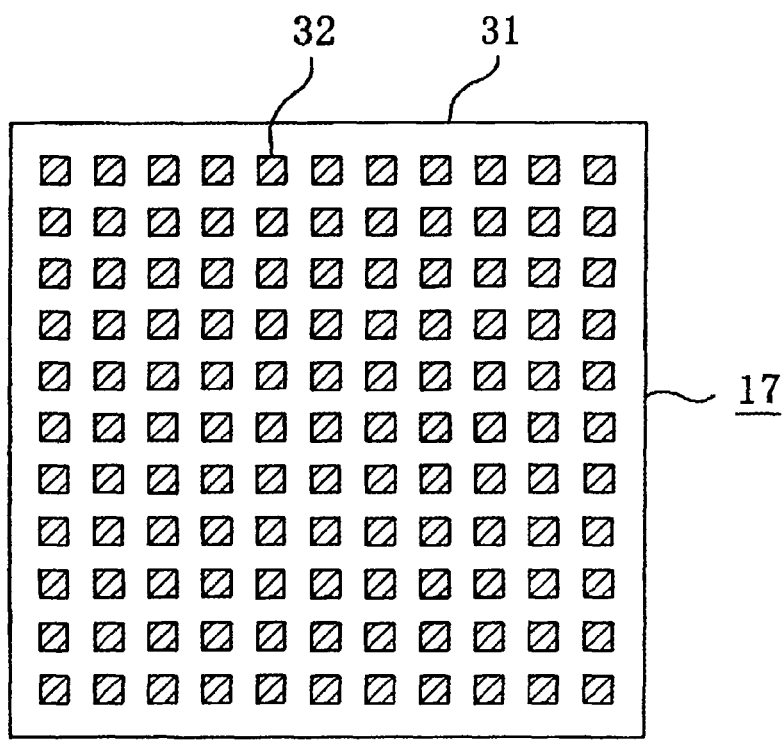
FIG. 15 is a plan view showing area array arrangement of electrodes.

Although the electrodes 32 of the wiring board 31 can be arranged in various forms, the optimal content of conductive particles 16 in the typical arrangements of the electrodes 32 shown in FIGS. 14 and 15 can be generally obtained as follows according to the formula (3):

The arrangement of FIG. 14 (peripheral arrangement) . . . 0.5 to 5 volume %; and The arrangement of FIG. 15 (area array arrangement) . . . 15 to 30 volume %.

It can be seen from the above result that, in order to from required bumps 19 on the electrodes 32, 0.5 to 30 volume % is enough as a content of the conductive particles 16 dispersed in the resin 14.

Especially according to the bump forming method of this embodiment, the fluid 14 can be retained on the first region 17 by the surface tension by using the substrate 40 having the protruding surface 13 formed thereon. Therefore, the fluid 14 can be prevented from moving beyond the first region 17 into a region other than the first region 17. As a result, the amount of conductive particles 16 can be suppressed to a more efficient amount. In other words, the conductive particles 16 that are going to be lost as they move beyond the first region 17 (in other words, excessive conductive particles 16) need not be considered or the proportion of considering such conductive particles 16 can be reduced.

Note that the weight ratio of the conductive particles 16 to the resin 14 is generally about 7, 0.5 to 30 volume % described above approximately corresponds to 4 to 75 weight %.

Moreover, the process of self-assembling the fluid between the protruding surface and the electrodes of the wiring board may be performed while varying the gap between the protruding surface and the wiring board. This enables the fluid to be efficiently self-assembled between the protruding surface and the electrodes.

Hereinafter, examples of the experimental results of the bump forming method of this embodiment will be described with reference to FIGS. 16 through 22.

Figure 16:
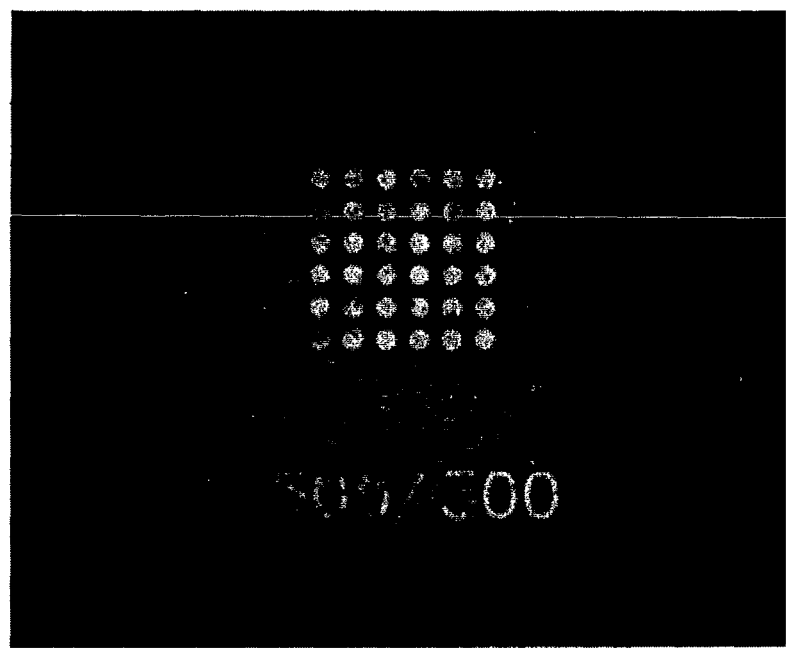
FIG. 16 is a microphotograph showing an experimental result of bump formation.
Figure 17:
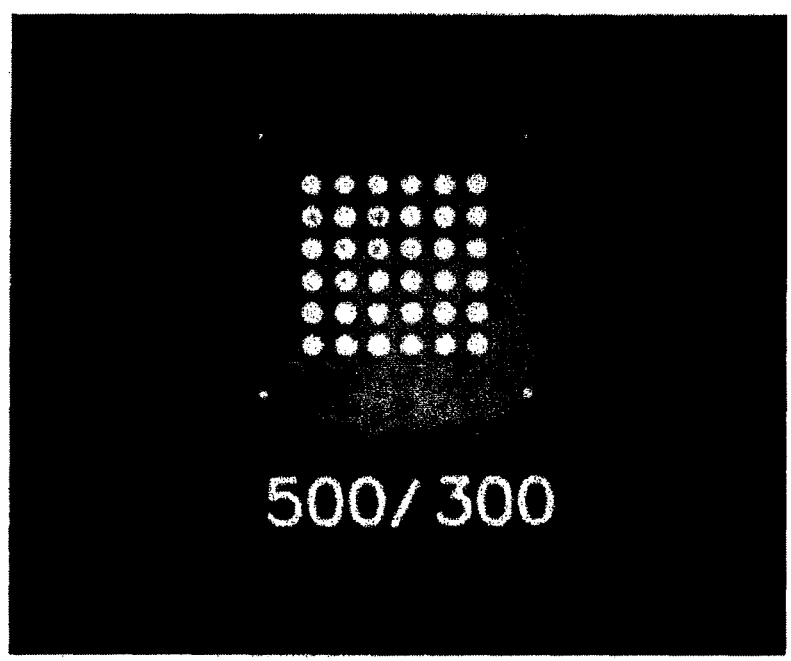
FIG. 17 is a microphotograph showing an experimental result of bump formation.

FIGS. 16 and 17 show examples of applying a fluid (resin paste) containing conductive particles and a gas bubble generating agent to a wiring board (FR-4 substrate) having a 6 by 6 peripheral electrode arrangement and heating the applied fluid.

FIG. 16 is an experimental example performed using a flat substrate (flat plate) having no protruding surface 13 formed thereon. As can be seen from FIG. 16, although bump formation is completed, the fluid (resin) flows out in a wide range. If there is another electrode or wiring in this range, the conductive particles may be assembled in this range. Note that the substrate used in the example of FIG. 16 is a 1 cm by 1 cm square glass substrate.

On the other hand, FIG. 17 is an experimental example performed using a substrate having a protruding surface 13 formed thereon. Note that this experiment was performed as a backup regarding a fluid (resin) containing no conductive particles. As can be seen from FIG. 17, the fluid (resin) is self-assembled on the electrodes. The substrate used in the example of FIG. 17 is a 1 cm by 1 cm square glass substrate having a protruding portion of a 4 mm by 4 mm square formed with a height of 400 μm as the protruding surface 13.

Figure 18:
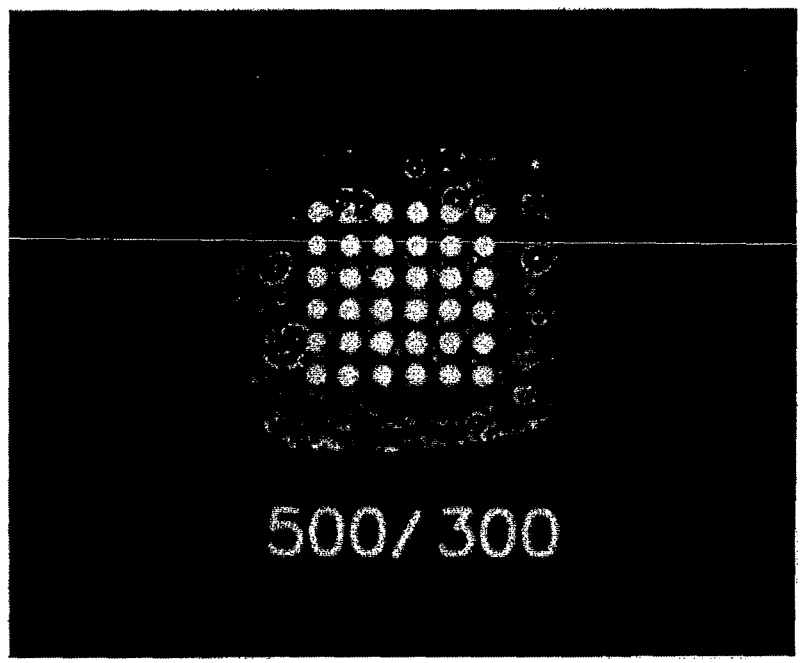
FIG. 18 is a microphotograph showing an experimental result of bump formation.

FIG. 18 is an experimental example performed for a fluid (resin) containing conductive particles by using the same substrate as that of the experimental example of FIG. 17. As can be seen from FIG. 18, bump formation is completed and the fluid (resin) is retained in a predetermined range (more specifically, the first region) by the surface tension effect of the protruding surface.

Figure 19:
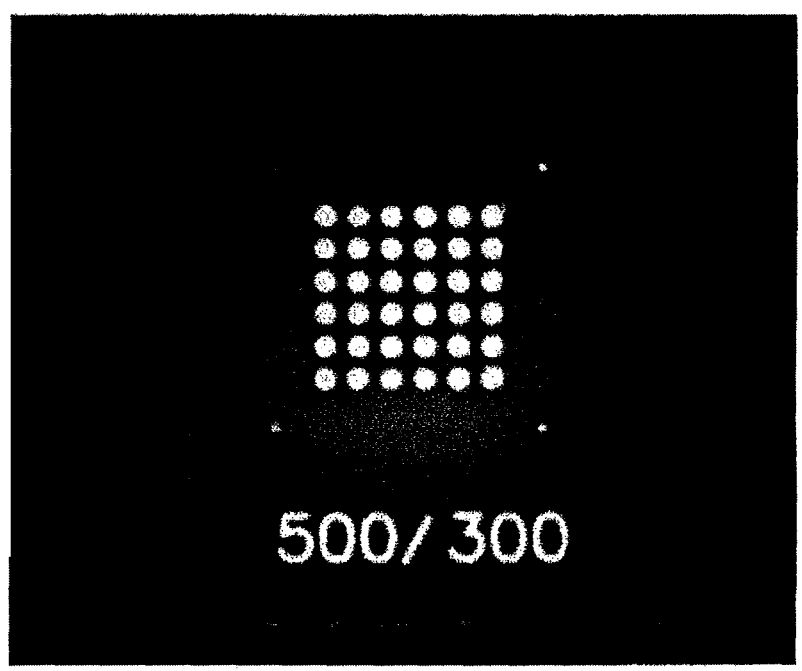
FIG. 19 is a microphotograph showing an experimental result of bump formation.
Figure 20:
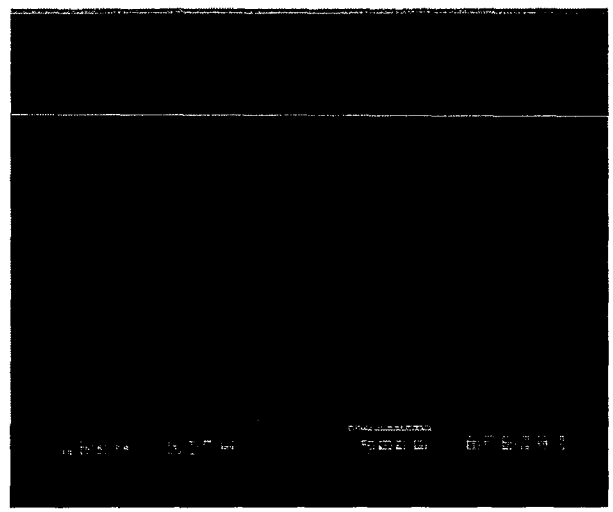
FIG. 20 is an SEM picture showing an experimental result of bump formation.

In the experimental example of FIG. 19, the bumps formed in a self-assembled manner were exposed by removing the resin from the experimental example of FIG. 18. It can also be seen from FIG. 19 that uniform bumps are beautifully formed by the bump forming method of this embodiment. Note that FIG. 20 is a SEM (Scanning Electron Microscope) picture of the bumps formed in this experimental example.

Figure 21:
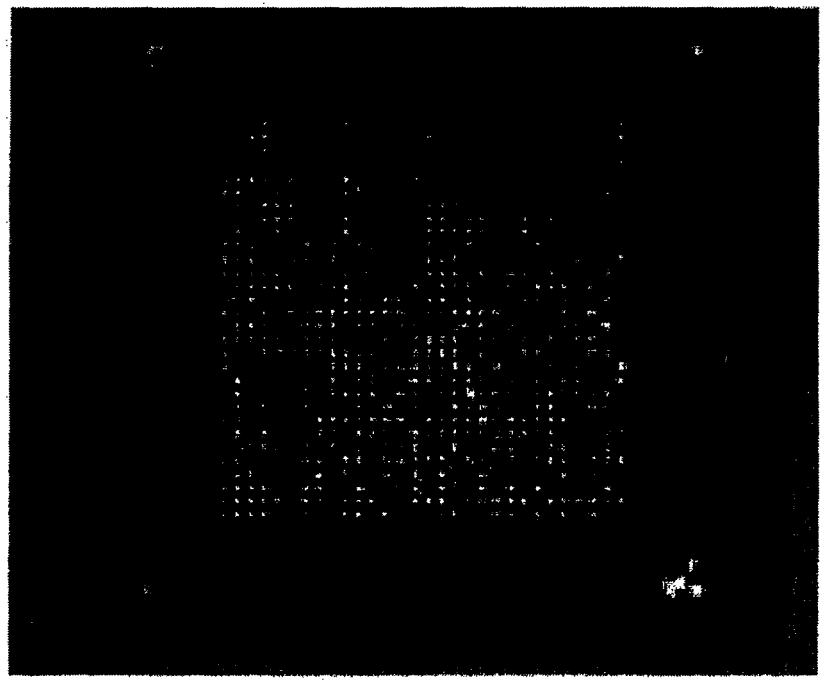
FIG. 21 is a microphotograph showing an experimental result of bump formation.

FIG. 21 shows an example of the experimental result of forming bumps on a wiring board having a large number of electrodes (30 by 30). FIG. 21 is an example performed using a flat substrate (flat plate) having no protruding surface 13 formed thereon. As can be seen from FIG. 21, bumps were able to be formed, but deviation of conductive particles is observed. Outflow of a fluid (resin) was also observed.

Figure 22:
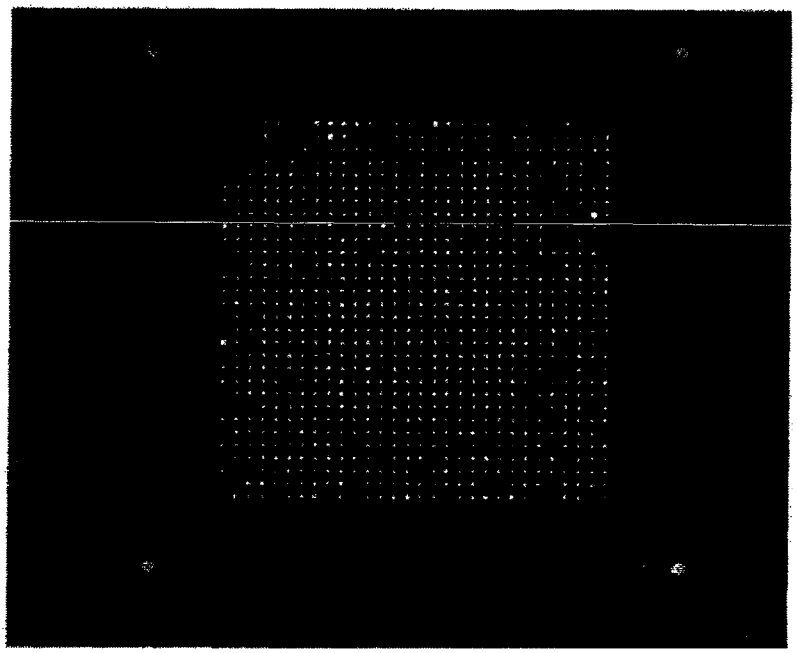
FIG. 22 is a microphotograph showing an experimental result of bump formation.

On the other hand, FIG. 22 is an example of the experimental result performed on the same wiring board as that of FIG. 21 by using a substrate having a protruding surface 13 formed thereon. As can be seen from FIG. 22, in this example as well, bump formation is completed, and such deviation of conductive particles as observed in FIG. 21 is not observed. It can also be seen that the fluid is retained in a predetermined range (more specifically, the first region 17) by the surface tension effect of the protruding surface 13. Note that the deviation of the conductive particles observed in FIG. 21 can be eliminated by using the substrate used in the example of FIG. 21 and carefully selecting the conditions. In the example of FIG. 22, however, the conditions can be relaxed and the degree of freedom in process selection can be improved.

As can be seen from the examples of FIGS. 21 and 22, it can be understood that the bump forming method of this embodiment is effective not only when the fluid is supplied to a part of the wiring board but when the fluid is supplied to the whole (or approximately the whole) wiring board.

Figure 23:
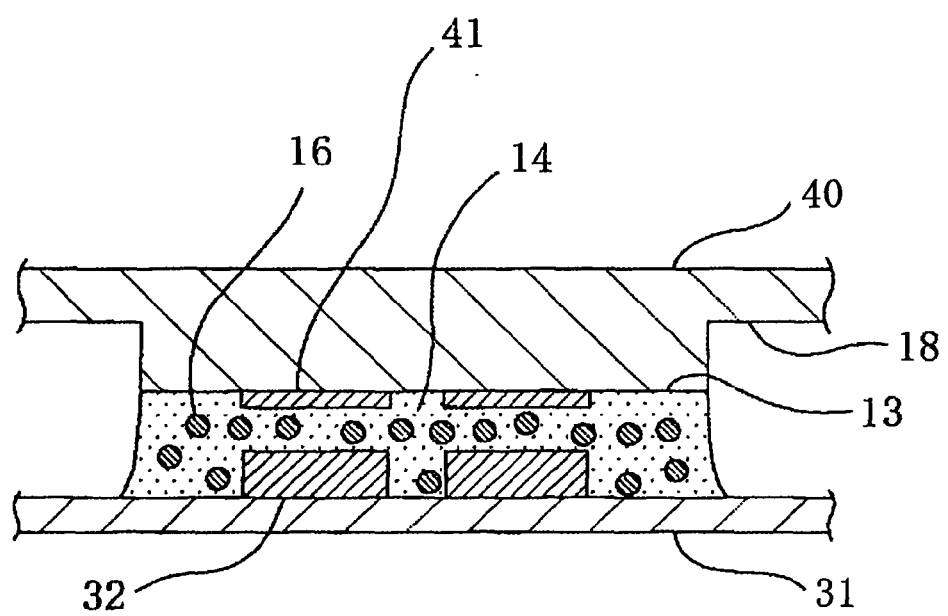
FIG. 23 is a diagram showing a structure of a modification of an embodiment of the invention.

The bump forming method of this embodiment described above can be modified as follows: although the protruding surface 13 of the substrate 40 has a flat surface in the above embodiment, the invention is not limited to this. For example, as shown in FIG. 23, the protruding surface 13 may have a convex pattern or electrode pattern 41 having approximately the same shape as that of the electrode 32 at the positions facing the plurality of electrodes 32 formed on the first region 17. Providing such a convex pattern or electrode pattern 41 at a predetermined location of the protruding surface 13 sometimes facilitates self-assembly of the solder powder. Note that the space (distance) between the first region 17 and the protruding surface 13 can be determined based on various conditions (for example, the viscosity of the resin, particle size of the solder powder, size of the electrodes, and the like). Note that it is also preferable to form a metal at least on the surface of the convex pattern or electrode pattern 41. The electrode pattern 41 made of a metal can be easily formed by a method such as printing.

The same effect as that of the bump forming method of this embodiment can be obtained not only by forming the protruding surface 13 on the substrate 40 but by forming a recess (or groove) 20 around a region 15 facing the first region 17 on the substrate 40. This will be briefly described with reference to FIGS. 24(a) through 24(c).

Figure 24:
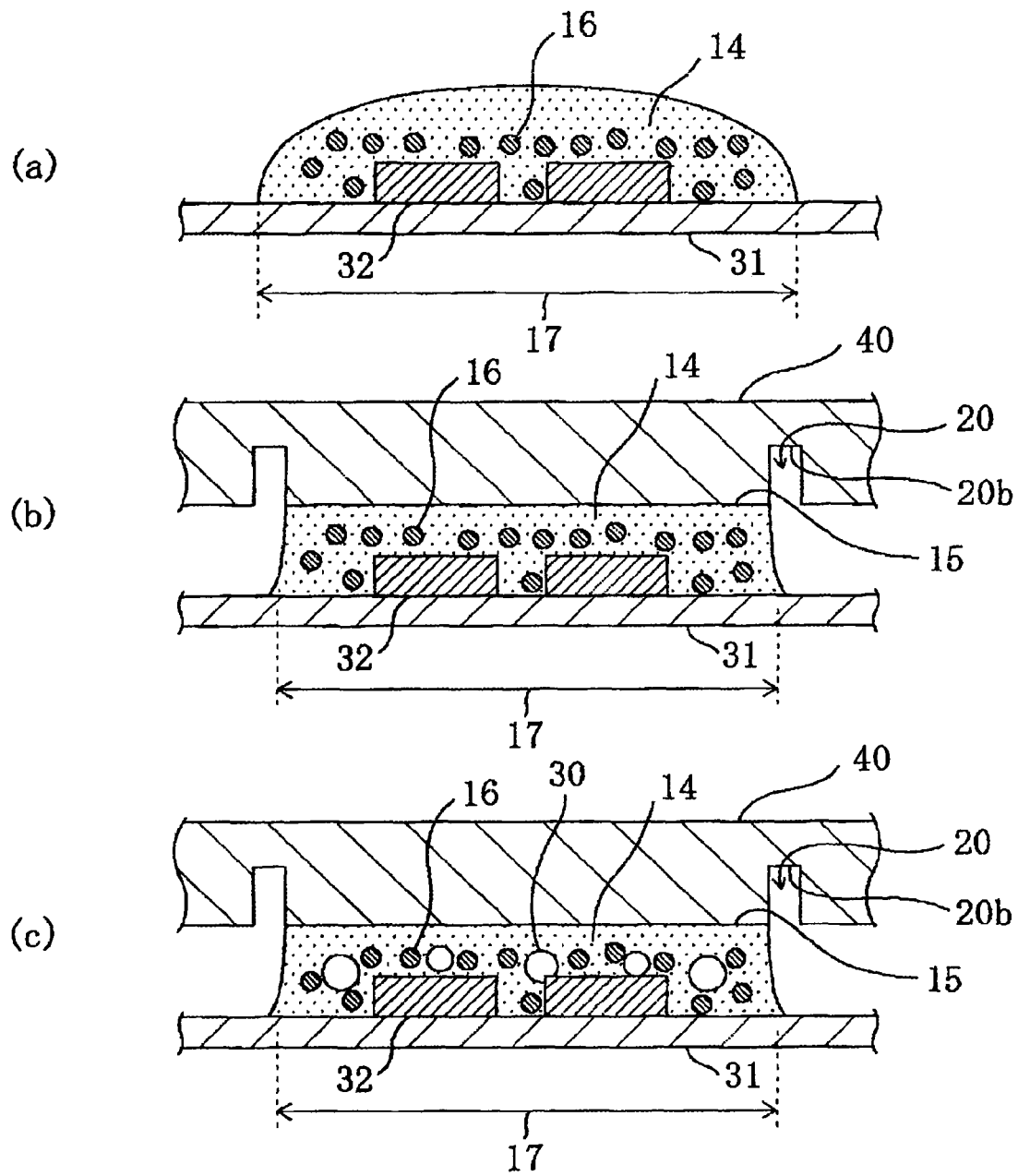
FIGS. 24(a) through 24(c) are process cross-sectional views showing a modification of an embodiment of the invention.

First, as shown in FIG. 24(a), the fluid 14 containing the conductive particles 16 and the gas bubble generating agent (not shown) is supplied onto the first region 17 including the electrodes 32 on a part of the wiring board 31 in the same manner as that of FIG. 11(a). Then, as shown in FIG. 24(b), the substrate 40 having the recess 20 formed around the region 15 facing the first region 17 of the wiring board 31 is disposed so as to face the first region 17 of the wiring board 31 so that the fluid 14 is interposed between the substrate 40 and the wiring board 31. The fluid 14 is surrounded by a bottom 20b of the recess 20. By heating the fluid 14 in this state, as shown in FIG. 24(c), gas bubbles 30 are generated from the gas bubble generating agent contained in the fluid 14.

As in the case of FIGS. 11(b) and 11(c), the fluid 14 is retained on the first region 17 by the surface tension in the case of FIGS. 24(b) and 24(c). The subsequent process is the same as that described in FIGS. 12(a) through 12(d), whereby the bumps 19 are formed on the electrodes 32 in a self-assembled manner.

Note that, like the substrate shown in FIG. 23, a convex pattern or electrode pattern 41 may be formed on the surface (the surface facing the wiring board 31) of the substrate 40 used in FIGS. 24(b) and 24(c).

The fluid 14, conductive particles 16, and gas bubble generating agent used in this embodiment are not specifically limited, but the following materials can be used:

Any material having a flowable viscosity in the range from room temperature to the melting temperature of the conductive particles 16 may be used as the fluid 14, and a material whose viscosity is reduced to a flowable value by heating is also included. Typical examples include: thermosetting resins such as epoxy resin, phenol resin, silicone resin, diallyl phthalate resin, furan resin, and melamine resin; thermoplastic resins such as polyester elastomer, fluororesin, polyimide resin, polyamide resin, and aramid resin; or photocurable (ultraviolet curable) resins; and combinations thereof. A high-boiling solvent, oil, and the like may be used in addition to the resins.

The materials shown in FIGS. 25 and 26 may be combined as appropriate to be used as the conductive particles 16 and the gas bubble generating agent. Note that, when the conductive particles 16 are made of a material whose melting point is higher than a boiling point of the gas bubble generating agent, the fluid 14 can be first heated so that gas bubbles are generated from the gas bubble generating agent and the fluid is self-assembled, and then the fluid 14 can further be heated so that the conductive particles in the self-assembled fluid are melted and metal-bonded to each other.

The gas bubble generating agent may be made of two or more kinds of materials having different boiling points. Different boiling points provide a difference in timing of generation and growth of the gas bubbles. As a result, the fluid 14 are pushed out stepwise by the growth of the gas bubbles, resulting in a uniform self-assembling process of the fluid 14. A uniform conductive pattern can thus be formed.

Note that, as the gas bubble generating agent, a material that is thermally decomposed to generate gas bubbles when the fluid 14 is heated may be used in addition to the materials shown in FIG. 26. The materials shown in FIG. 27 may be used as such a gas bubble generating agent. For example, a compound containing water of crystallization (aluminum hydroxide) is thermally decomposed when the fluid 14 is heated, and water vapor is generated as gas bubbles.

Hereinafter, a preferred bump forming apparatus for performing the bump forming method of this embodiment will be described with reference to FIGS. 28 through 37.

Figure 28:
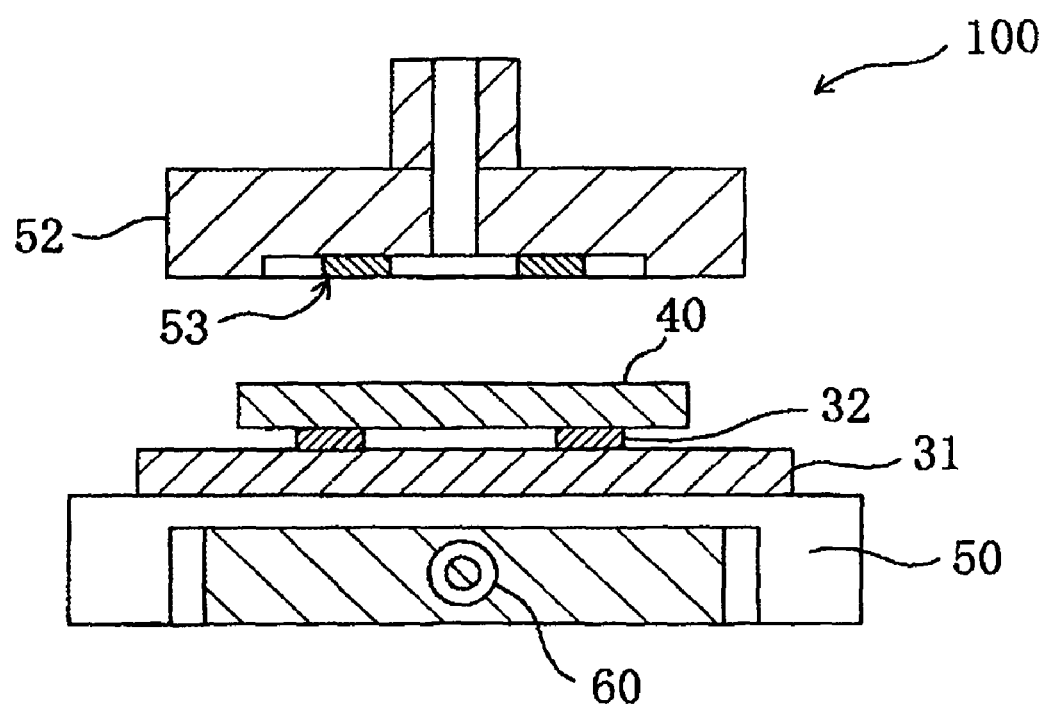
FIG. 28 is a cross-sectional view schematically showing a bump forming apparatus according to an embodiment of the invention.
Figure 29:
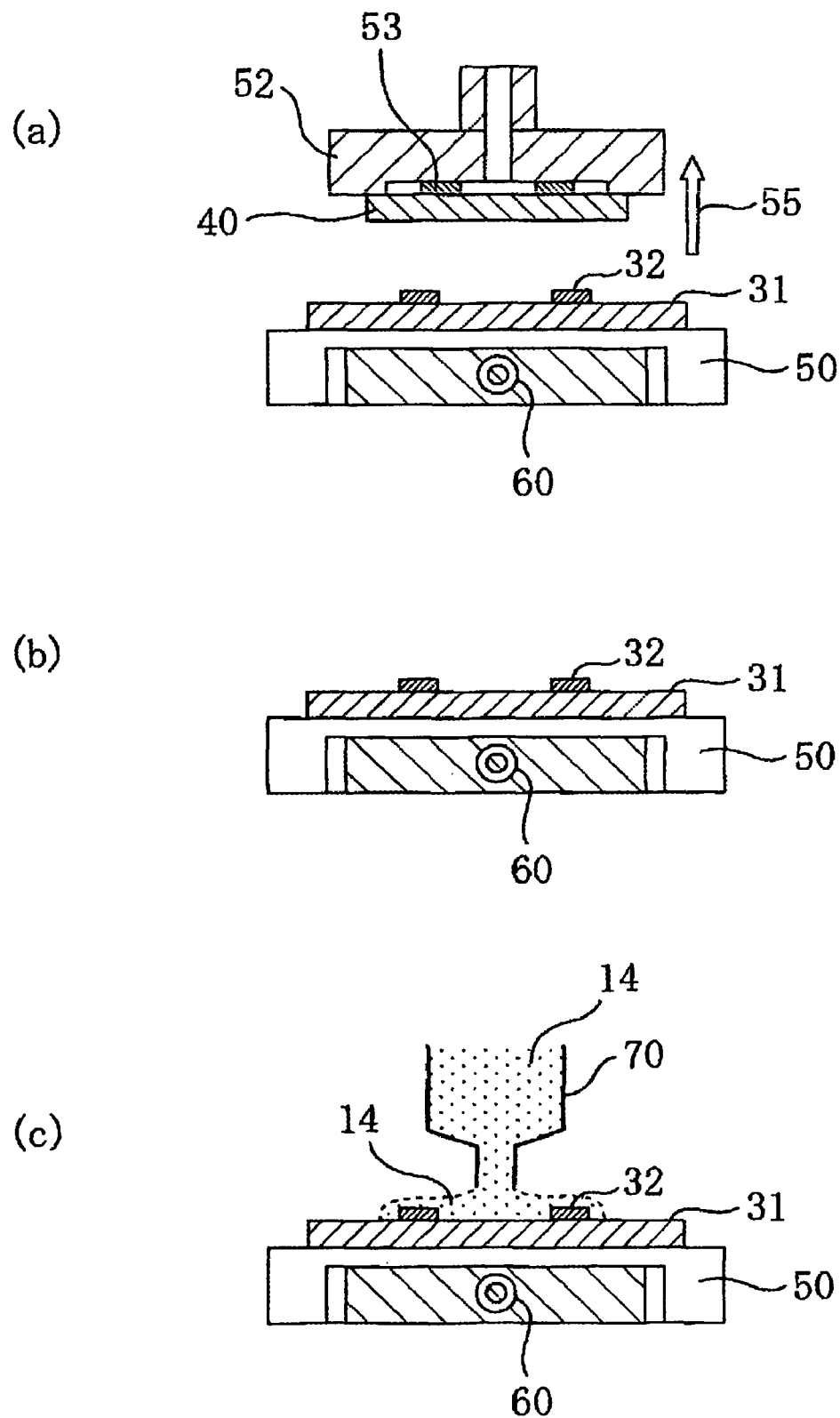
FIGS. 29(a) through 29(c) are process cross-sectional views illustrating an operation of a bump forming apparatus according to an embodiment of the invention.
Figure 30:
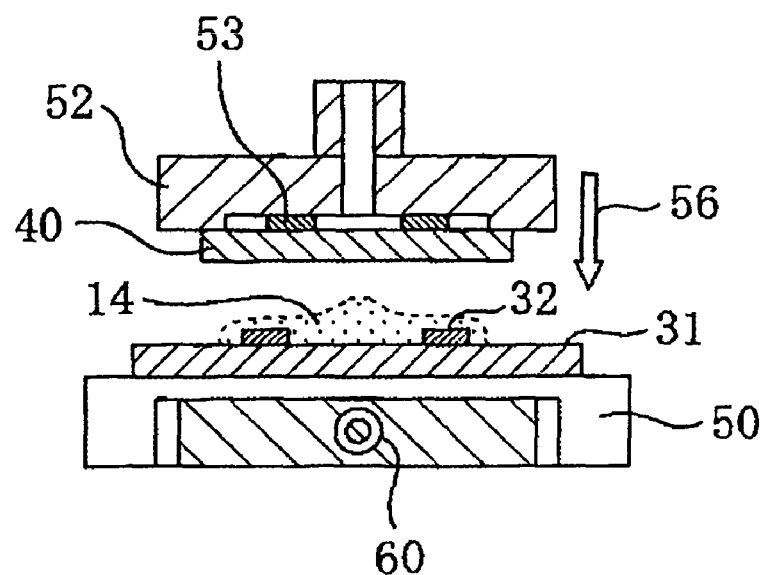
FIGS. 30(a) and 30(b) are process cross-sectional views illustrating an operation of a bump forming apparatus according to an embodiment of the invention.
Figure 30:
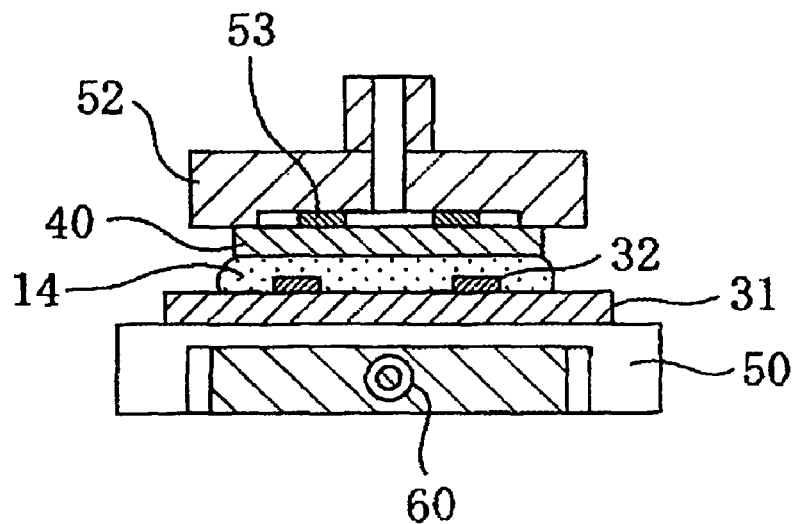
Figure 31:
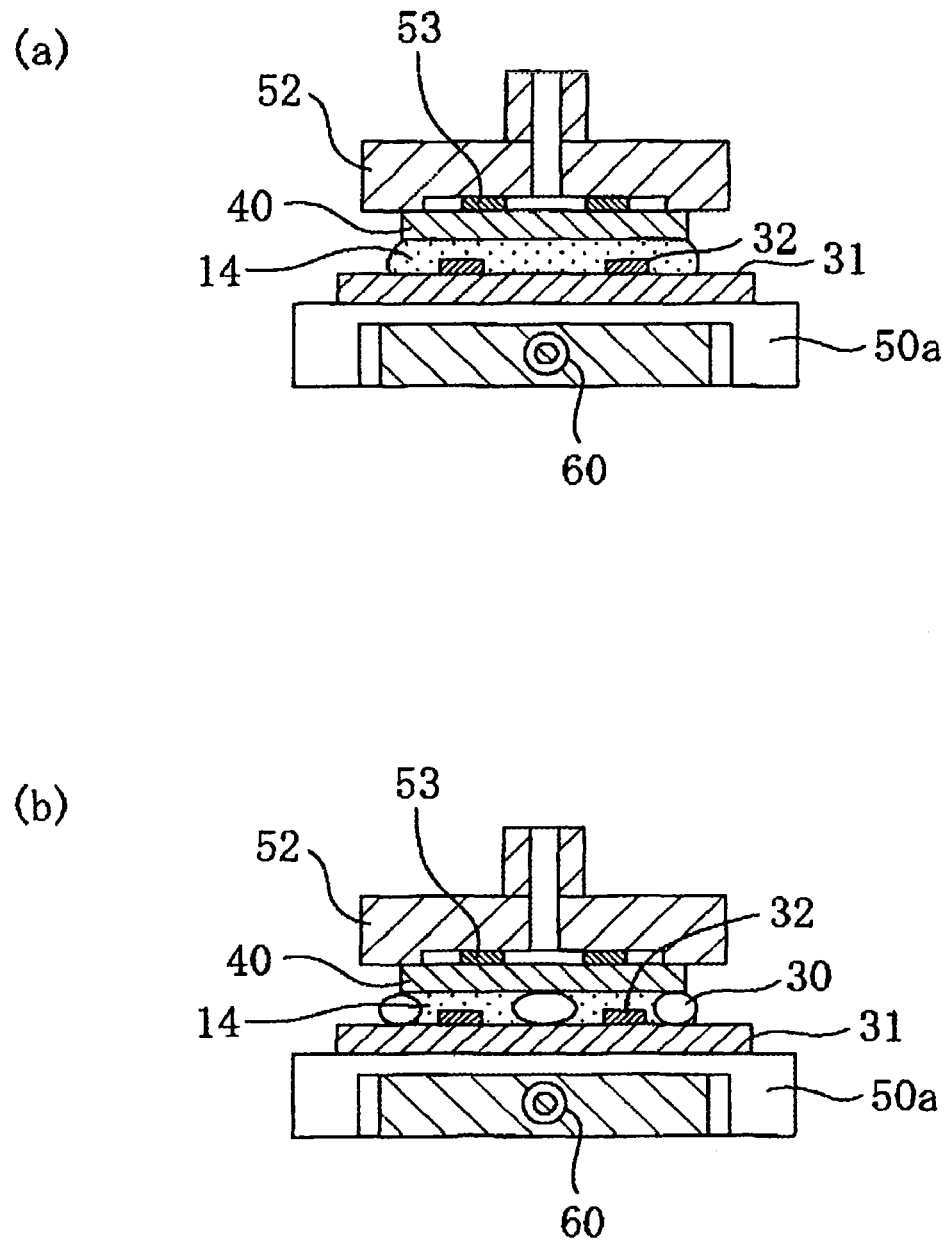
FIGS. 31(a) and 31(b) are process cross-sectional views illustrating an operation of a bump forming apparatus according to an embodiment of the invention.
Figure 32:
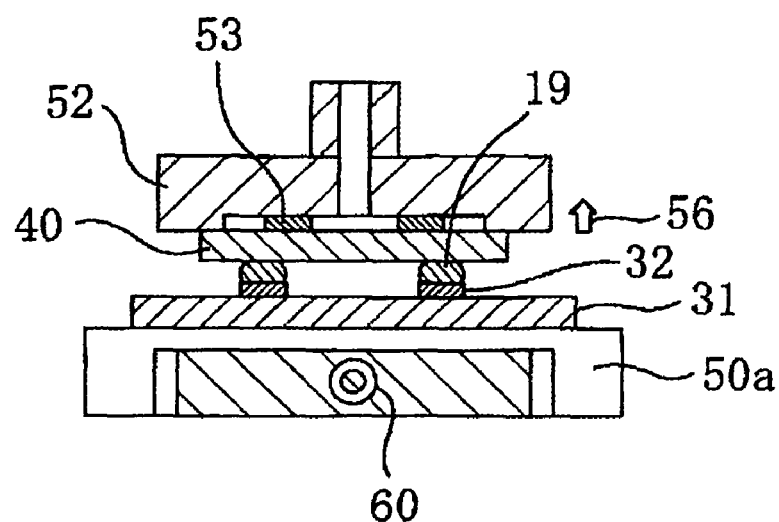
FIGS. 32(a) and 32(b) are process cross-sectional views illustrating an operation of a bump forming apparatus according to an embodiment of the invention.
Figure 32:
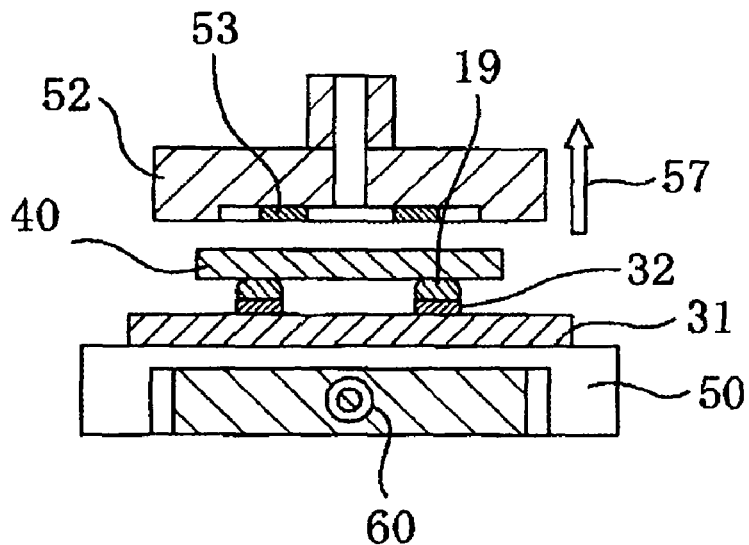
Figure 33:
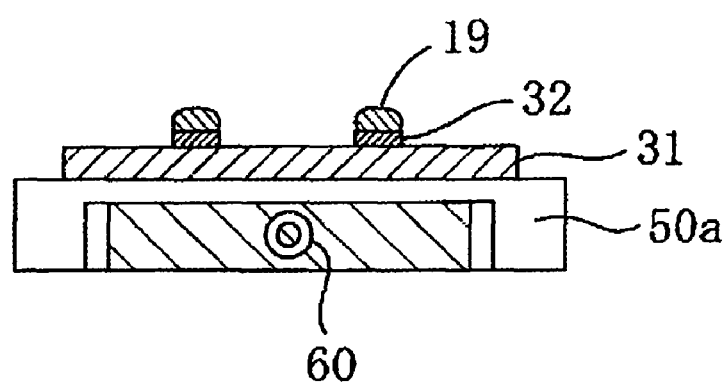
FIGS. 33(a) and 33(b) are process cross-sectional views illustrating an operation of a bump forming apparatus according to an embodiment of the invention.
Figure 33:
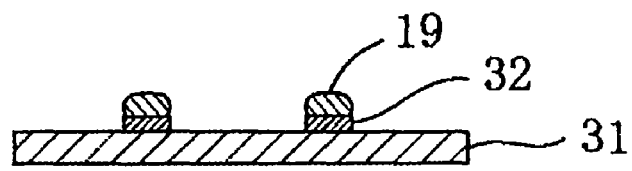
Figure 34:
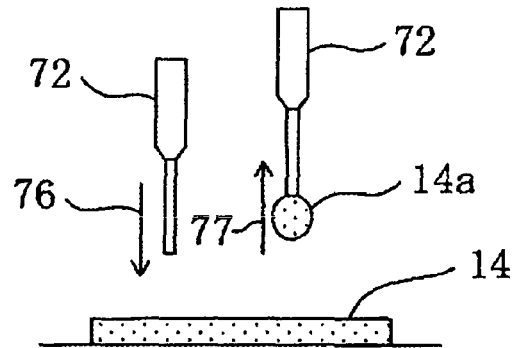
FIGS. 34(a) and 34(b) are diagrams illustrating a paste supply method using a needle member.
Figure 34:
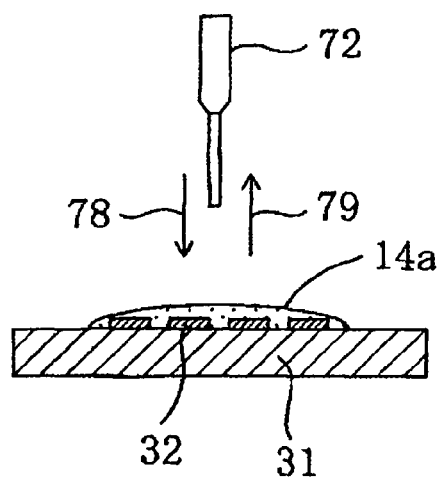

FIG. 28 schematically shows a bump forming apparatus 100 according to an embodiment of the invention. The bump forming apparatus 100 of this embodiment is an apparatus for forming bumps on a wiring board 31, and is formed by a stage 50 on which the wiring board 31 is placed, and a header 52 that is disposed so as to face the stage 50.

The header 52 includes a sucking means 53 capable of sucking a substrate (plate-like member) 40 disposed above the stage 50 and has a means (not shown) capable of moving up and down with the substrate 40 sucked thereon. A heating means is provided in at least one of the header 52 and the stage 50. In the example of FIG. 28, a heating means 60 is attached to the stage 50. The heating means 60 of this embodiment is a heater capable of heating the wiring board 31. The heating means may be attached to both the stage 50 and the header 52 so that heating can be provided from both above and beneath.

In the structure of this embodiment, the heating means 60 can heat the wiring board 31, and the header 52 can hold the plate-like member 40 at a predetermined distance (first distance) from the stage 50 during heating.

Hereinafter, an example of operation of the bump forming apparatus 100 of this embodiment will be described with reference to FIGS. 29(a) through 33(b).

First, as shown in FIG. 29(a), the plate-like member 40 is sucked by the sucking means 53 of the header 52, and the header 52 is moved upward in this state (arrow 55). The header 52 can be moved by a movable means such as a motor.

On the other hand, the wiring board 31 having electrodes 32 formed thereon is placed on the stage 50. The stage 50 includes a means capable of sucking and fixing the wiring board 31 and the wiring board 31 can be fixed on the stage 50 by this means. A resin wiring board (for example, a FR-4 substrate), ceramic substrate, or the like can be used as the wiring board 31. Not only a rigid substrate but a flexible substrate can be used. Note that the wiring board 31 of this embodiment may be such an intermediate substrate (interposer) as used in a BGA (Ball Grid Array).

The state shown in FIG. 29(b) is obtained by moving the header 52. Then, as shown in FIG. 29(c), the fluid 14 is applied to a region including the electrodes 32 on the wiring board 31 by using a dispenser 70. The dispenser 70 is filled with the fluid (for example, a resin paste) 14.

The fluid 14 of this embodiment contains conductive particles and a gas bubble generating agent. The fluid 14 is a resin in this embodiment. Note that, in this embodiment, the fluid 14 is sometimes referred to as a paste.

In this embodiment, the operation process was described from the state shown in FIG. 29(a). However, it should be understood that the process can be started from the state shown in FIG. 29(b). Moreover, the method for applying the fluid (resin paste) 14 is not limited to application by the dispenser 70, and other methods can be used.

Then, as shown in FIG. 30(a), the header 52 is moved downward (arrow 56) so that the plate-like member 40 approaches the stage 50. Then, as shown in FIG. 30(b), the paste 14 is interposed between the plate-like member 40 and the wiring board 31 placed on the stage 50. In other words, the header 52 is moved so that a predetermined distance (first distance) is produced between the wiring board 31 and the plate-like member 40 through the paste 14. This predetermined distance (space) is larger than the particle size of the conductive particles contained in the paste.

Then, as shown in FIG. 31(a), the stage 50 is heated by the heater 60 (the stage during heating is shown by "50a") to heat the paste 14 applied to the wiring board 31. As a result, as shown in FIG. 31(b), gas bubbles 30 are generated from the gas bubble generating agent contained in the paste 14.

During the heating, the header 52 holds the plate-like member 40 at a predetermined distance from the stage 50. Since the plate-like member 40 is fixed by the header 52, the gas bubbles 30 from the gas bubble generating agent pass through a region of a larger space between the plate-like member 40 and the wiring board 31 (for example, a region where the electrodes 32 are not formed on the wiring board 31) and blown out from the outer edge of the plate-like member 40.

As the heating process progresses, as shown in FIG. 32(a), bumps 19 are formed on the electrodes 32. In other words, the bumps 19 are formed on the electrodes 32 of the wiring board 31 through self-assembly of the resin based on the influence of the gas bubbles 30 from the gas bubble generating agent and subsequent self-aligned self-assembly of the solder.

Note that the header 52 may be controlled so as to be firmly fixed at the predetermined distance (first distance) from the stage 50 during heating. Alternatively, in order to facilitate self-assembly of the resin and self-assembly of the solder, the header 52 may be controlled so as to move slightly upward (arrow 56) to slightly increase the distance according to the profile of the heating process. The header 52 may be controlled so not only to increase the distance but also to vary the distance in a fluctuating manner. Such distance control may be performed in order to obtain the effect of increasing the bump height or obtaining a uniform bump height. In the case where the distance is varied during heating, the distance may be varied by about 10% or less of the first distance, although the amount may be varied depending on the process.

The process of heating the paste 14 may be performed by heating from the header 52 through the plate-like member 40 together with heating form the stage 50. In this case, the plate-like member 40 is preferably made of a material having a high thermal conductivity (for example, a ceramic material).

After the bumps 19 are formed on the electrodes 32 of the wiring board 31 through self-assembly of the resin based on the influence of the gas bubbles 30 from the gas bubble generating agent and subsequent self-aligned self-assembly of the solder, heating by the heater 60 is stopped and the header 52 is moved upward (arrow 57) as shown in FIG. 32(b). At this time, as shown in FIG. 32(b), the header 52 may be moved upward either while leaving the plate-like member 40 or while sucking the plate-like member 40. Note that, after bump formation, the plate-like member 40 is replaced with a new one or reused after washing.

Note that, by moving the plate-like member 40 in the up-down direction by an appropriate amount after formation of the bumps 19, variation in height of the formed bumps 19 can be suppressed. As a result, in, for example, metal bonding in a flip chip mounting process conducted after bump formation, parallelism can be improved, whereby connection reliability can be improved.

Finally, the plate-like member 40 is removed as shown in FIG. 33(a), and the wiring board 31 is detached and removed from the stage 50 as shown in FIG. 33(b), whereby the wiring board 31 having the bumps 19 formed on the electrodes 32 can be obtained.

Note that the fluid (resin) 14 may be left after the plate-like member 40 is removed. However, since fine conductive particles (solder powder) may remain on the fluid 14 as a residue after bump formation, it is preferable in view of reliability to remove the fluid 14 together with the residue.

In addition, when, for example, a semiconductor chip is used as the plate-like member 40, flip chip mounting can be performed by using the bump forming method of this embodiment. In other words, a semiconductor mounting body (module) flip chip mounted on the wiring board 31 can be formed without removing the plate-like member 40. In this case, when the fluid 14 is a curable resin, the fluid 14 can be cured to be used as an underfill. Note that the fluid 14 may be removed and an underfill may be injected thereafter.

The stage 50 may be a movable stage so that the steps shown in FIGS. 29(a) through 33(b) can be performed in an assembly line manner. For example, the following operation can be performed: the plate-like member 40 is moved upward from the state shown in FIG. 32(a) (or FIG. 32(b)), the wiring board 31 having the bumps formed thereon is removed, and the state shown in FIG. 29(b) is obtained. The stage 50 is moved from the state shown in FIG. 29(b) to a position under the dispenser 70. After the paste is applied, the stage 50 is moved so that the process from FIG. 30(a) to FIG. 31(b) (or the process to FIG. 32(a) or 32(b)) is performed.

In the bump forming apparatus 100 of this embodiment of the invention, the heating means (heater) 60 is provided in at least one of the stage 50 on which the wiring board 31 is to be placed or the header 52 having a means capable of sucking the plate-like member 40 and of moving in an up-down direction, and the header 52 can hold the plate-like member 40 during heating by the heating means 60. Therefore, when the fluid (paste) 14 containing the conductive particles and the gas bubble generating agent is supplied onto the stage 50 through the wiring board 31, gas bubbles 30 can generated from the gas bubble generating agent by heating of the heating means (heater) 60 and the conductive particles can be self-assembled on the electrodes 32 of the wiring board 31 by the generated gas bubbles 30. As a result, highly productive bump formation can be performed.

In the above embodiment, the dispenser 70 is used to supply a paste as the fluid 14. Various types of dispensers such as an air pulse type, jet type, screw type, and mechanical type can be used as appropriate. Supply of the paste 14 is not limited to a method using a dispenser, but other methods may be used. For example, as shown in FIGS. 34(a) and 34(b), the paste 14 may be applied to the wiring board 31 by using a needle member 72 capable of dipping the paste 14.

More specifically, as shown in FIG. 34(a), the needle member 72 is moved downward (arrow 76) into a place where the paste 14 is stored, and a part 14a of the paste 14 is obtained by using the surface tension of the needle member 72 (arrow 77).

Then, as shown in FIG. 34(b), the needle member 72 holding the part 14a of the paste 14 thereon is moved to apply the part 14a of the paste 14 onto the wiring board 31 (arrow 78), and the needle member 72 is then moved upward (arrow 79).

The paste 14 can thus be supplied onto the wiring board 31. In the case where the amount of paste 14 required on the wiring board 31 is small (or very small), it may be difficult to adjust the supply amount by the dispenser 70. However, a small amount of paste 14 can be easily supplied by the needle member 72. Moreover, providing the dispenser 70 may increase the cost of the bump forming apparatus. However, since the needle member 72 is a simple device, this problem can be relatively easily avoided by using the needle member 72.

Figure 35:
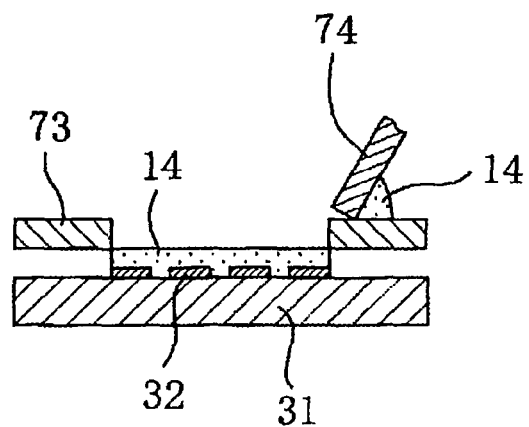
FIG. 35 is a cross-sectional view illustrating a paste supply method.
Figure 36:
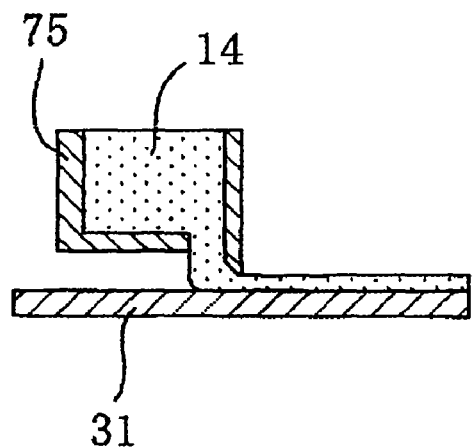
FIG. 36 is a cross-sectional view illustrating a paste supply method.

Instead of using the needle member 72, the paste 14 may be supplied by printing by using a mask 73 and a squeegee 74 as shown in FIG. 35. As shown in FIG. 36, the paste 14 may alternatively be supplied by a blade using a blade device 75.

Figure 37:
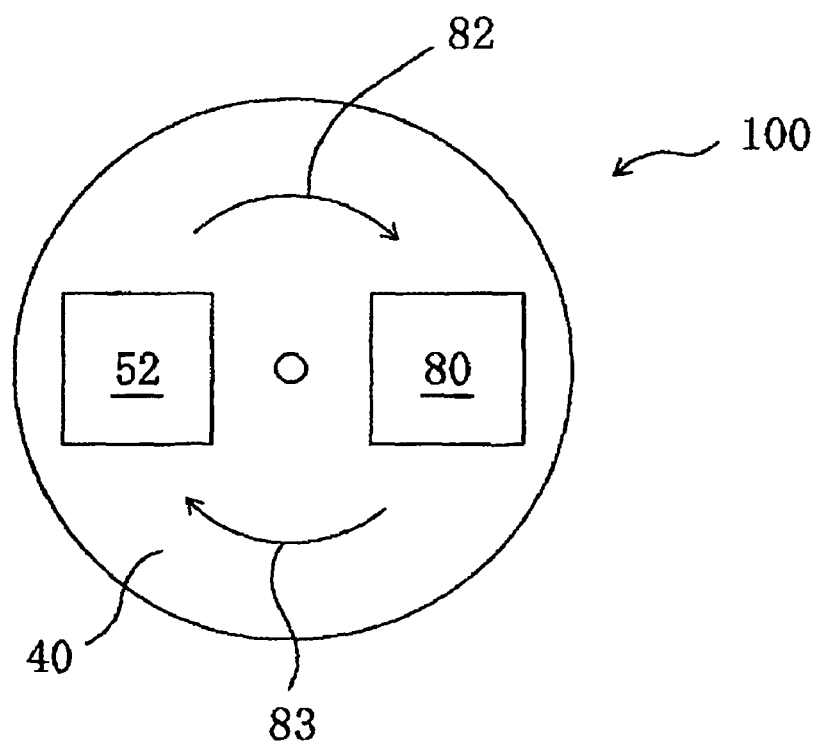
FIG. 37 is a top view schematically showing a modification of a bump forming apparatus according to an embodiment of the invention.

The bump forming apparatus 100 of this embodiment may further include a means for rotating the plate-like member 40. FIG. 37 shows a structure of the bump forming apparatus 100 when viewed from above. In the example of FIG. 37, the bump forming apparatus 100 has a means capable of rotating the plate-like member 40, and a washing device 80 is provided in a region different from the header 52. The illustrated bump forming apparatus 100 can perform a bump forming operation as follows: after bumps are formed at the position of the header 52, the plate-like member 40 is rotated (arrow 82) to the position of the washing device 80 where the plate-like member 40 is washed. Then, the plate-like member 40 is rotated again (arrow 83), and bumps are formed again at the position of the header 52. This rotating means may be provided in the header 52 or may be provided at a different position from the header 52.

The inventors of the present application carried out experiments of forming bumps 19 of a narrow-pitch array type (for example, an electrode 32 pitch of up to about 500 μm or less) and found that, in some cases, a difference was observed depending on whether the wiring board 31 was placed vertically above or below the plate-like member 40. The difference can be ignored unless the bumps are narrow-pitch bumps. When the wiring board 31 was placed below the plate-like member 40 (that is, on the stage 50 side), the bumps 19 were able to be formed without causing problems such as short circuit regardless of whether heating was conducted from beneath (heating from the stage 50 side) or from above (heating from the plate-like member 40 side). On the other hand, when the wiring board 31 was placed above the plate-like member 40 (that is, on the header 52 side), there were some cases in which short circuit occurred between the formed bumps 19 regardless of whether heating was conducted from beneath (heating from the stage 50 side) or from above (heating from the plate-like member 40 side).

Figure 38:
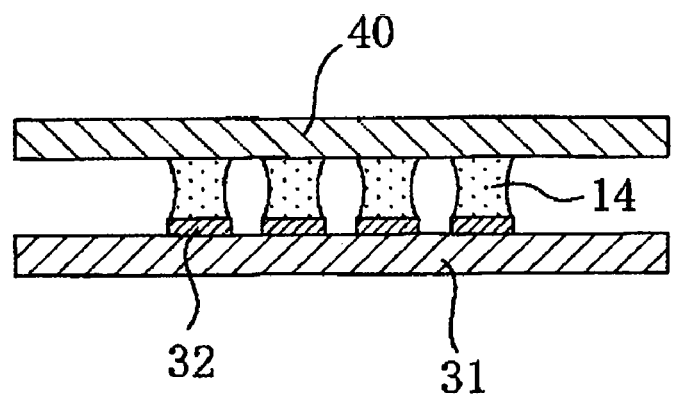
FIG. 38(a) is a cross-sectional view showing a structure in which a wiring board is placed below.
FIG. 38(b) is a cross-sectional view showing a structure in which a wiring board is placed above.
Figure 38:
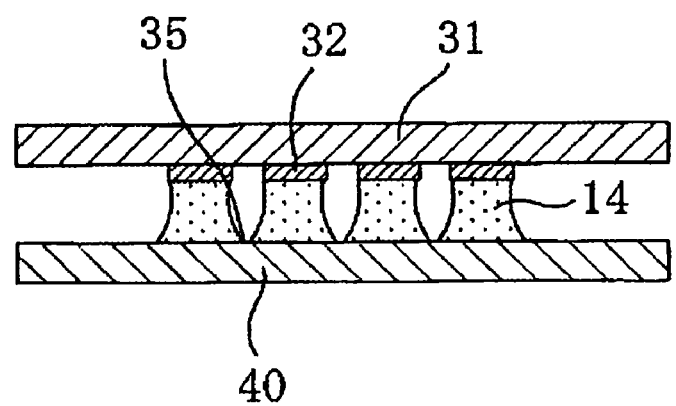

It is inferred that this is due to the influences of spreading of the fluid (resin) 14 by the surface tension of the plate-like member 40 and gravity of the fluid (resin) 14. More specifically, it is considered that, as shown in FIG. 38(a), when the wiring board 31 is placed below the plate-like member 40, spreading of the fluid 14 can be retained within a certain range and short circuit is less likely to occur; as shown in FIG. 38(b), however, when the wiring board 31 is placed above the plate-like member 40, the fluid 14 spreads more than expected and therefore short circuit 35 is more likely to occur. It is therefore preferable to locate the wiring board 31 below the plate-like member 40 especially in the case of a narrow pitch (for example, in the case where the distance between the lands that are to be electrodes on which the bumps 19 are formed is 50 μm or less).

Experiments were also carried out about the heating rate during heating for bump formation. It was found from the experiments that, by performing heating at 100° C./sec. or higher (preferably, 150° C./sec. or higher), the bumps 19 can be formed even when the process conditions are not strictly controlled and are relaxed to some degree according to the material to be used. For example, when a resin wiring board 31 was placed below the plate-like member 40 and the heating process was performed at a temperature rise rate of 310° C./sec., 155° C./sec., and 103° C./sec. (heating time: 30 seconds), the bumps 19 were able to be formed without causing problems such as short-circuit. For example, a ceramic heater can be used as the heating means 60.

Note that a more expensive heating device (heater) 60 is used as the temperature rise rate is increased especially for process optimization. It is therefore desirable to relax that condition (the temperature rise rate) as much as possible. In this case, it is preferable to perform heating from both the wiring board 31 side and the plate-like member 40 side. For example, constant heating at an approximately constant temperature (in other words, auxiliary heating or preheating) may be performed from the wiring board 31 side, and heating involving temperature rise may be performed from the plate-like member 40 side. In the case of performing heating from the plate-like member 40 side, it is preferable to use a substrate having a higher thermal conductivity than that of a glass substrate (for example, a ceramic substrate). Moreover, when a ceramic wiring board is used as the wiring board 31, the efficiency of heating from beneath (heating from the stage 50 side) can be improved.

As described above, according to the method of this embodiment, the fluid 14 containing the conductive particles 16 is pushed outside the gas bubbles by the growth of the gas bubbles 30, whereby the fluid 14 is assembled into a columnar shape on the electrodes 32. By melting the conductive particles 16 contained in the assembled fluid 14, the bumps 19 made of the melted conductive particles 16 can be formed on the electrodes 32 in a self-aligned manner.

Accordingly, even in the case where self-assembly on the electrodes could not be successfully implemented by merely using wettability, the bumps 19 made of the melted conductive particles 16 can be formed on the electrodes 32 in a self-assembled manner by the method of this embodiment. Moreover, since the conductive particles can be efficiently self-assembled on the electrodes 32, required bumps 19 can be formed on the electrodes 32 with an appropriate amount of conductive particles without having an excessive amount of conductive particles contained in the fluid 14.

It should be understood that although the invention has thus been described using the preferred embodiments, such description is not a restrictive matter and various modifications can be made.

INDUSTRIAL APPLICABILITY

According to the invention, a method for selectively forming bumps by a simple method can be provided.

The invention claimed is:
1. A method for forming bumps on electrodes of a wiring board, comprising the steps of:
(a) supplying a fluid containing conductive particles and a gas bubble generating agent onto a first region including the electrodes on the wiring board;

(b) disposing a substrate having a protruding surface formed on a main surface thereof so that the protruding surface faces the first region of the wiring board;

(c) heating the fluid to generate gas bubbles from the gas bubble generating agent contained in the fluid; and (d) heating the fluid to melt the conductive particles contained in the fluid, wherein in the step (c), the fluid is self-assembled on the electrodes by the gas bubbles generated from the gas bubble generating agent, and in the step (d), the conductive particles contained in the fluid self-assembled on the electrodes are melted to form the bumps on the electrodes.

2. The bump forming method according to claim 1, wherein, in the step (a), the first region to which the fluid is supplied is a partial region of the wiring board.

3. The bump forming method according to claim 1, wherein the substrate is a light-transmitting substrate.

4. The bump forming method according to claim 3, wherein the light-transmitting substrate is a glass substrate.

5. The bump forming method according to claim 1, wherein a convex pattern or electrode pattern is formed at a position facing the electrodes on the protruding surface of the substrate.

6. The bump forming method according to claim 1, wherein the gas bubble generating agent contained in the fluid is made of a material that boils or a material that is thermally decomposed to generate a gas when the fluid is heated in the step (c).

7. The bump forming method according to claim 1, wherein, in the step (c), the fluid is heated while having the protruding surface of the substrate abut on the fluid supplied onto the wiring board.

8. The bump forming method according to claim 7, wherein, in the step (c), a space is provided between the electrodes formed on the wiring board and the protruding surface of the substrate.

9. The bump forming method according to claim 8, wherein a size of the space varies in the step (c).

10. The bump forming method according to claim 8, wherein the space is larger than a particle size of the conducive particles.

11. The bump forming method according to claim 1, wherein, in the step (c), the gas bubbles generated from the gas bubble generating agent are discharged to outside from a periphery of the space provided between the substrate and the wiring board.

12. The bump forming method according to claim 1, further comprising the step of removing the substrate after the step (d).

13. The bump forming method according to claim 1, wherein the substrate is placed vertically above the wiring board.

14. A method for forming bumps on electrodes of a wiring board, comprising the steps of:

(a) supplying a fluid containing conductive particles and a gas bubble generating agent onto a first region including the electrodes on a part of the wiring board;

(b) disposing a substrate having a recess formed on a main surface thereof so that a bottom of the recess surrounds the first region of the wiring board;

(c) heating the fluid to generate gas bubbles from the gas bubble generating agent contained in the fluid; and (d) heating the fluid to melt the conductive particles contained in the fluid, wherein in the step (c), the fluid is self-assembled on the electrodes by the gas bubbles generated from the gas bubble generating agent, and in the step (d), the conductive particles contained in the fluid self-assembled on the electrodes are melted to form the bumps on the electrodes.

15. The bump forming method according to claim 14, wherein, in the step (a), the first region to which the fluid is supplied is a partial region of the wiring board.

16. An apparatus for forming bumps on electrodes of a wiring board by the bump forming method of claim 1, comprising:

a stage on which the wiring board is to be placed;

a header for holding a substrate having a protruding surface or a recess formed on a main surface thereof; and a heating means for heating the stage or the header, wherein a fluid containing conductive particles and a gas bubble generating agent is supplied onto a first region including the electrodes on the wiring board placed on the stage, the substrate held by the header is disposed so that the protruding surface faces the first region of the wiring board or so that a bottom of the recess surrounds the first region of the wiring board, the fluid is heated by the heating means so that the fluid is self-assembled on the electrodes by gas bubbles generated from the gas bubble generating agent contained in the fluid, and the fluid is further heated by the heating means so that the conductive particles contained in the fluid self-assembled on the electrodes are melted to form the bumps on the electrodes.

17. The bump forming method according to claim 9, wherein the space is larger than a particle size of the conducive particles.

18. An apparatus for forming bumps on electrodes of a wiring board by the bump forming method of claim 14, comprising:

a stage on which the wiring board is to be placed;

a header for holding a substrate having a protruding surface or a recess formed on a main surface thereof; and a heating means for heating the stage or the header, wherein a fluid containing conductive particles and a gas bubble generating agent is supplied onto a first region including the electrodes on the wiring board placed on the stage, the substrate held by the header is disposed so that the protruding surface faces the first region of the wiring board or so that a bottom of the recess surrounds the first region of the wiring board, the fluid is heated by the heating means so that the fluid is self-assembled on the electrodes by gas bubbles generated from the gas bubble generating agent contained in the fluid, and the fluid is further heated by the heating means so that the conductive particles contained in the fluid self-assembled on the electrodes are melted to form the bumps on the electrodes.

* * * * *